(12) United States Patent
Shin et al.

(10) Patent No.: US 11,289,488 B2
(45) Date of Patent: Mar. 29, 2022

(54) SEMICONDUCTOR MEMORY DEVICE

(71) Applicant: Samsung Electronics Co., Ltd., Suwon-si (KR)

(72) Inventors: Joongchan Shin, Seoul (KR); Jiyoung Kim, Yongin-si (KR); Hui-Jung Kim, Seongnam-si (KR); Taehyun An, Seoul (KR); Eunju Cho, Yecheon-gun (KR); Hyungeun Choi, Suwon-si (KR); Sangyeon Han, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 252 days.

(21) Appl. No.: 16/744,572

(22) Filed: Jan. 16, 2020

(65) Prior Publication Data
US 2020/0411523 A1   Dec. 31, 2020

(30) Foreign Application Priority Data
Jun. 27, 2019   (KR) .................. 10-2019-0077319

(51) Int. Cl.
H01L 27/108   (2006.01)
G11C 5/06   (2006.01)

(52) U.S. Cl.
CPC ........ H01L 27/10808 (2013.01); G11C 5/063 (2013.01)

(58) Field of Classification Search
CPC ......... H01L 27/10808; H01L 27/10847; H01L 27/10805; H01L 27/11519; H01L 27/11521; H01L 27/11526; H01L 27/11556; H01L 27/11565; H01L 27/11568; H01L 27/11573; H01L 27/11582; H01L 27/11551; H01L 29/40117; H01L 29/792; G11C 5/063
See application file for complete search history.

(56) References Cited

U.S. PATENT DOCUMENTS

| 8,766,349 B2 | 7/2014 | Park et al. |
| 9,397,110 B2 | 7/2016 | Lue |
| 9,728,539 B2 | 8/2017 | Choi et al. |
| 9,837,155 B1 | 12/2017 | Kim et al. |

(Continued)

FOREIGN PATENT DOCUMENTS

KR   101442177 B1   9/2014
KR   20190008065 A   1/2019

Primary Examiner — Mohammed R Alam
(74) Attorney, Agent, or Firm — Harness, Dickey & Pierce, P.L.C.

(57) ABSTRACT

Disclosed is a semiconductor memory device including a stack structure including layers which are vertically stacked on a substrate and each of which includes a bit line extending in a first direction and a semiconductor pattern extending in a second direction from the bit line, a gate electrode which is in a hole penetrating the stack structure and extending along a stack of semiconductor patterns, a vertical insulating layer covering the gate electrode and filling the hole, and a data storage element electrically connected to the semiconductor pattern. The data storage element includes a first electrode, which is in a first recess of the vertical insulating layer and has a cylindrical shape whose one end is opened, and a second electrode, which includes a first protrusion in a cylinder of the first electrode and a second protrusion in a second recess of the vertical insulating layer.

20 Claims, 41 Drawing Sheets

(56) References Cited

U.S. PATENT DOCUMENTS

| | | |
|---|---|---|
| 10,109,791 B2 | 10/2018 | Kwon |
| 2010/0159650 A1 | 6/2010 | Song et al. |
| 2016/0141299 A1* | 5/2016 | Hong .................... H01L 29/511 257/324 |
| 2016/0293605 A1 | 10/2016 | Yamazaki et al. |
| 2017/0179155 A1* | 6/2017 | Or-Bach ............... H01L 27/249 |
| 2018/0175042 A1 | 6/2018 | Jang et al. |
| 2019/0013317 A1 | 1/2019 | Luan et al. |
| 2019/0067298 A1 | 2/2019 | Karda et al. |

* cited by examiner

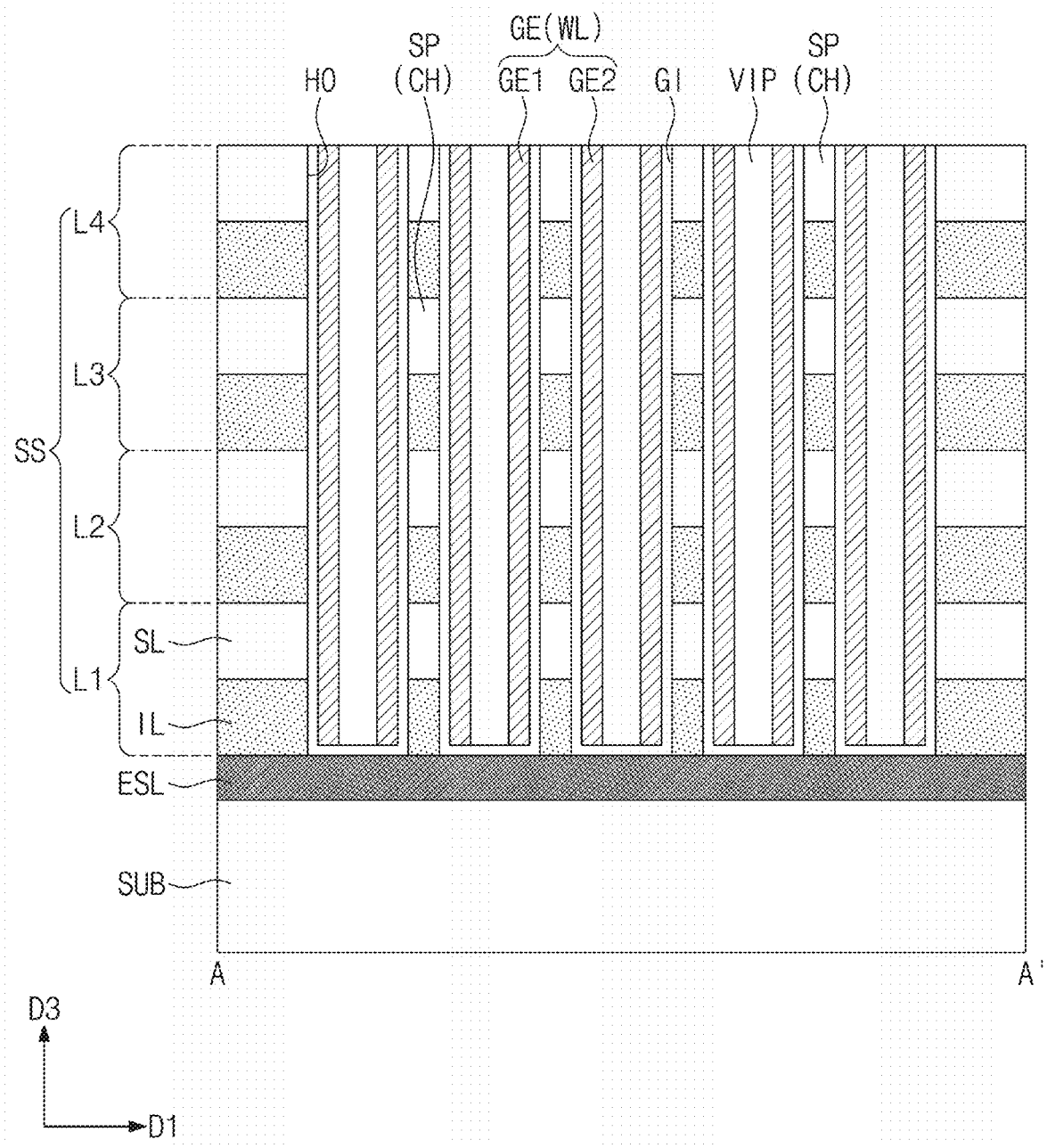

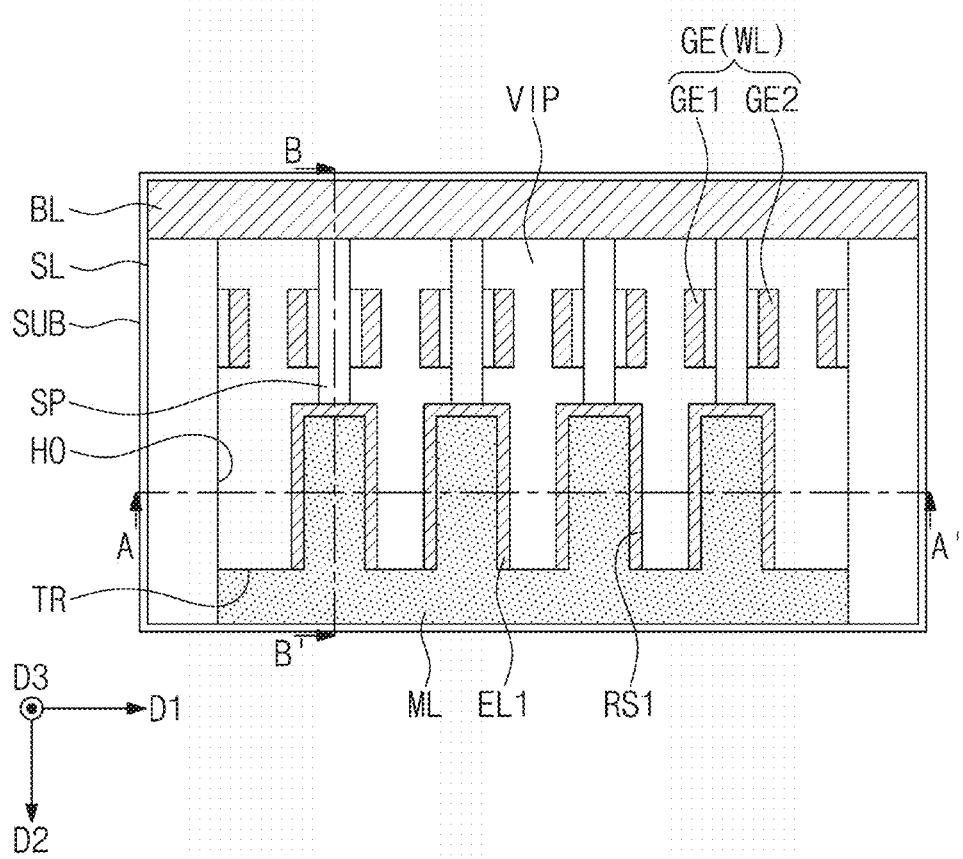

SEMICONDUCTOR MEMORY DEVICE

CROSS-REFERENCE TO RELATED APPLICATION

This U.S. nonprovisional application claims priority under 35 U.S.C. § 119 to Korean Patent Application No. 10-2019-0077319 filed on Jun. 27, 2019 in the Korean Intellectual Property Office, the entire contents of which are hereby incorporated by reference.

BACKGROUND

Inventive concepts relate to a semiconductor device, and more particularly, to a three-dimensional semiconductor memory device with increased integration.

Semiconductor devices have been highly integrated for satisfying high performance and low manufacture costs of semiconductor devices which are required by customers. Since integration of semiconductor devices is an important factor in determining product price, high integrated semiconductor devices are increasingly demanded. Integration of typical two-dimensional or planar semiconductor devices is primarily determined by the area occupied by a unit memory cell, such that it is greatly influenced by the level of technology for forming fine patterns. However, the extremely expensive processing equipment needed to increase pattern fineness may set a practical limitation on increasing the integration of the two-dimensional or planar semiconductor devices. Therefore, there have been proposed three-dimensional semiconductor memory devices having three-dimensionally arranged memory cells.

SUMMARY

Some example embodiments of inventive concepts provide a three-dimensional semiconductor memory device with improved electrical characteristics and increased reliability.

According to some example embodiments of inventive concepts, a semiconductor memory device may include: a substrate, a stack structure on the substrate, a gate electrode, a vertical insulating layer, and a data storage element. The stack structure may define a hole that penetrates the stack structure in a vertical direction. The stack structure may include a plurality of layers vertically stacked on the substrate. The stack structure may include a plurality of bit lines extending in a first direction and a plurality of semiconductor patterns extending in a second direction that intersects the first direction. Each of the plurality of layers may include a corresponding one of the plurality of semiconductor patterns extending in the second direction from a corresponding one of the plurality of bit lines. The gate electrode may be in the hole that penetrates the stack structure. The gate electrode may vertically extend along a stack of the plurality of the semiconductor patterns. The vertical insulating layer may cover the gate electrode and fill the hole. The vertical insulating layer may define a first recess and a second recess. The data storage element may be electrically connected to the corresponding one of the plurality of semiconductor patterns in a corresponding one of the plurality of layers. The data storage element may include a first electrode and a second electrode. The first electrode may be in the first recess of the vertical insulating layer. The first electrode may have a cylindrical shape whose one end is opened. The second electrode may include a first protrusion in a cylinder of the first electrode and a second protrusion in the second recess of the vertical insulating layer.

According to some example embodiments of inventive concepts, a semiconductor memory device may include: a substrate, a stack structure on the substrate, a gate electrode, a plurality of first electrodes, a dielectric layer on the substrate, and a second electrode on the substrate. The stack structure may define a hole that penetrates the stack structure in a vertical direction. The stack structure may include a plurality of layers vertically stacked on the substrate. The stack structure may include a plurality of bit lines extending in a first direction and a plurality of semiconductor patterns extending in a second direction that intersects the first direction. Each of the plurality of layers may include a corresponding one of the plurality of semiconductor patterns extending in the second direction from a corresponding one of the plurality of bit lines. The gate electrode may be in the hole that penetrates the stack structure. The gate electrode may vertically extend along a stack of the plurality of the semiconductor patterns. The plurality of first electrodes electrically may be connected to the plurality of semiconductor patterns, respectively. Each of the plurality of first electrodes may have a cylindrical shape whose one end is opened. The second electrode may be spaced apart from the plurality of first electrodes across the dielectric layer. The second electrode may include: a first protrusion in a cylinder of a corresponding one of the plurality of first electrodes, the first protrusion extending in the second direction; and a second protrusion between two of the plurality of first electrodes that are vertically adjacent to each other, the second protrusion extending in the second direction. A maximum width in the first direction of the second protrusion may be greater than a maximum width in the first direction of the first protrusion.

According to some example embodiments of inventive concepts, a semiconductor memory device may include: a substrate, a stack structure on the substrate, a gate electrode, a vertical insulating layer, and a data storage element. The stack structure may define a hole that penetrates the stack structure in a vertical direction. The stack structure may include a plurality of layers vertically stacked on the substrate. The stack structure may include a plurality of bit lines extending in a first direction and a plurality of semiconductor patterns extending in a second direction that intersects the first direction. Each of the plurality of layers may include a corresponding one of the plurality of semiconductor patterns extending in the second direction from a corresponding one of the plurality of bit lines. The gate electrode may be in the hole that penetrates the stack structure. The gate electrode may vertically extend along a stack of the plurality of the semiconductor patterns. The vertical insulating layer may cover the gate electrode and fill the hole. The vertical insulating layer may define a pair of first recesses and a second recess between the pair of first recesses. The pair of first recesses may expose one end of a pair of the plurality of semiconductor patterns and may extend in the second direction. The pair of first recesses may be vertically adjacent to each other and the second recess may extend in the second direction. The data storage element may be electrically connected to the corresponding one of the plurality of semiconductor patterns in a corresponding one of the plurality of layers. The data storage element may include a first electrode in one of the pair of first recesses and a second electrode in the second recess. A maximum width in the first direction of the second recess may be greater than a maximum width in the first direction of the first recess.

BRIEF DESCRIPTION OF THE DRAWINGS

FIGS. 4A, 4B, and 4C illustrate cross-sectional views respectively taken along lines A-A', B-B', and C-C' of FIG. 3.

FIGS. 5, 7, 9, 11, 13, 15, and 17 illustrate plan views showing a method of fabricating a three-dimensional semiconductor memory device according to some example embodiments of inventive concepts.

DETAILED DESCRIPTION OF EMBODIMENTS

Figure 1:
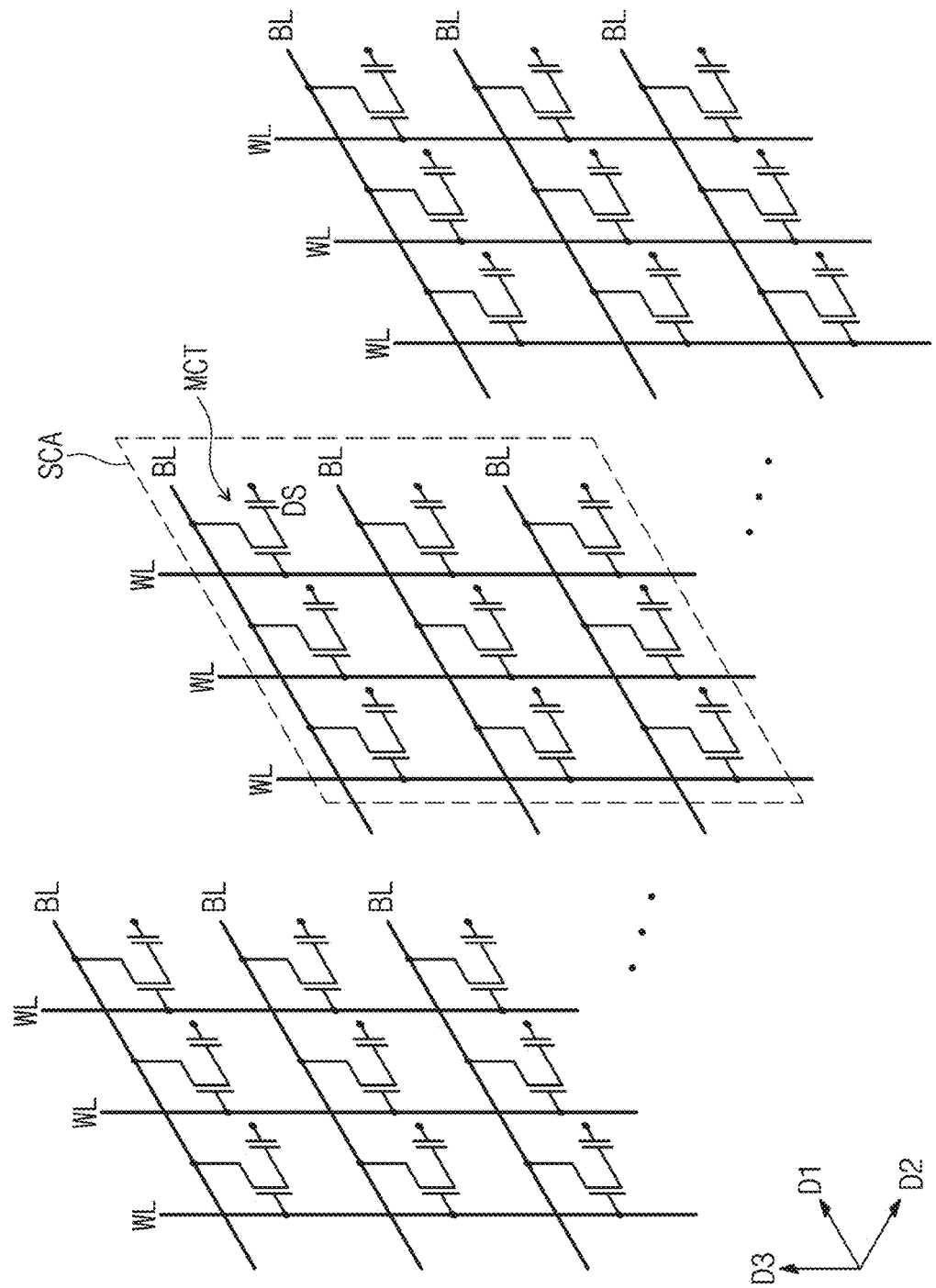
FIG. 1 illustrates a simplified circuit diagram showing a cell array of a three-dimensional semiconductor memory device according to some example embodiments of inventive concepts.

FIG. 1 illustrates a simplified circuit diagram showing a cell array of a three-dimensional semiconductor memory device according to some example embodiments of inventive concepts.

Referring to FIG. 1, a three-dimensional semiconductor memory device according to some example embodiments of inventive concepts may include a cell array including (or consisting of) a plurality of sub-cell arrays SCA. The sub-cell arrays SCA may be arranged along a second direction D2.

Each of the sub-cell arrays SCA may include a plurality of bit lines BL, a plurality of word lines WL, and a plurality of memory cell transistors MCT. One memory cell transistor MCT may be disposed between one word line WL and one bit line BL.

The bit lines BL may be conductive patterns (e.g., metal lines) spaced apart from and disposed on a substrate. The bit lines BL may extend in a first direction D1. The bit lines BL in one sub-cell array SCA may be spaced apart from each other in a vertical direction (e.g., a third direction D3).

The word lines WL may be conductive patterns (e.g., metal lines) that extend in the vertical direction (e.g., the third direction D3) from the substrate. The word lines WL in one sub-cell array SCA may be spaced apart from each other in the first direction D1.

A gate of the memory cell transistor MCT may be connected to the word line WL, and a source of the memory cell transistor MCT may be connected to the bit line BL. Each of the memory cell transistors MCT may include a data storage element DS. For example, the data storage element DS may be a capacitor, and a drain of the memory cell transistor MCT may be connected to the capacitor.

Figure 2:
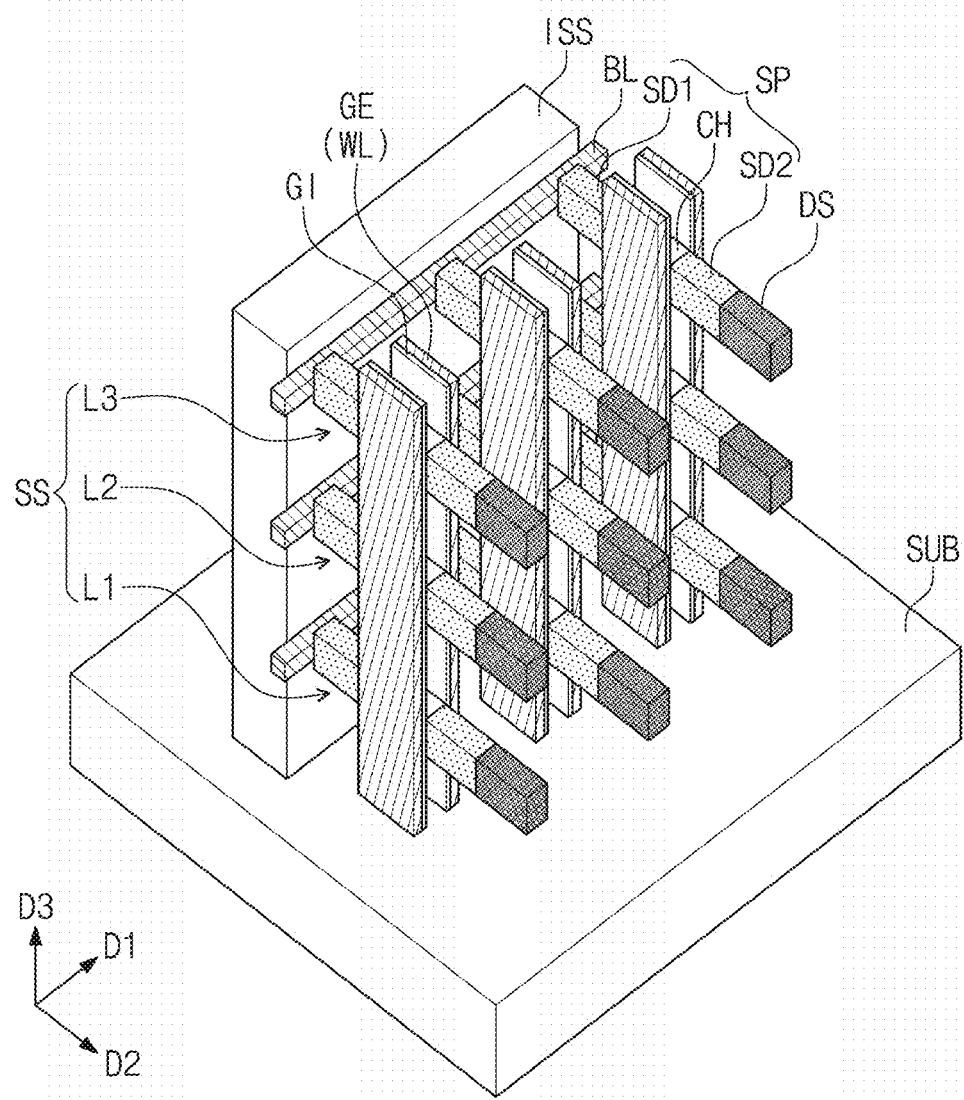
FIG. 2 illustrates a perspective view showing a three-dimensional semiconductor memory device according to some example embodiments of inventive concepts.

FIG. 2 illustrates a perspective view showing a three-dimensional semiconductor memory device according to some example embodiments of inventive concepts.

Referring to FIGS. 1 and 2, a substrate SUB may be provided thereon with one of a plurality of sub-cell arrays SCA discussed with reference to FIG. 1. The substrate SUB may be semiconductor substrate, such as a silicon substrate, a germanium substrate, or a silicon-germanium substrate.

For example, the substrate SUB may be provided thereon with a stack structure SS including first, second, and third layers L1, L2, and L3. The first, second, and third layers L1, L2, and L3 of the stack structure SS may be spaced apart and stacked in a vertical direction (e.g., a third direction D3). Each of the first, second, and third layers L1, L2, and L3 may include a plurality of semiconductor patterns SP, a plurality of data storage elements DS, and a bit line BL.

Each of the semiconductor patterns SP may have a linear, bar, or pillar shape extending in a second direction D2. For example, the semiconductor patterns SP may include silicon, germanium, or silicon-germanium. Each of the semiconductor patterns SP may include a channel region CH, a first impurity region SD1, and a second impurity region SD2. The channel region CH may be interposed between the first and second impurity regions SD1 and SD2. The channel region CH may correspond to a channel of the memory cell transistor MCT discussed with reference to FIG. 1. The first and second impurity regions SD1 and SD2 may correspond to source and drain of the memory cell transistor MCT discussed with reference to FIG. 1.

The first and second impurity regions SD1 and SD2 may be zones where the semiconductor pattern SP is doped with impurities. The first and second impurity regions SD1 and SD2 may then have an n-type or p-type conductivity. The first impurity region SD1 may be formed on an upper portion of the semiconductor pattern SP.

The data storage elements DS may be correspondingly connected to ends of the semiconductor patterns SP. The data storage elements DS may be correspondingly connected to the second impurity regions SD2 of the semiconductor patterns SP. The data storage elements DS may be memory elements capable of storing data. Each of the data storage elements DS may be a memory element using one of a capacitor, a magnetic tunnel junction pattern, and a variable resistance member that includes a phase change material. For example, each of the data storage elements DS may be a capacitor.

Each of the bit lines BL may have a linear or bar shape extending in a first direction D1. The bit lines BL may be spaced apart from each other and stacked along the third direction D3. The bit lines BL may include a conductive material. For example, the conductive material may include one or more of a doped semiconductor material (doped silicon, doped germanium, etc.), a conductive metal nitride material (titanium nitride, tantalum nitride, etc.), a metallic material (tungsten, titanium, tantalum, etc.), and a metal-semiconductor compound (tungsten silicide, cobalt silicide, titanium silicide, etc.). The bit lines BL may correspond to the bit lines BL discussed with reference to FIG. 1.

Among the first, second, and third layers L1, L2, and L3, the first layer L1 will be representatively described in detail below. The semiconductor patterns SP of the first layer L1 may be arranged spaced apart from each other in the first direction D1. The semiconductor patterns SP of the first layer L1 may be located at the same first level. The bit line BL of the first layer L1 may be connected to ends of the semiconductor patterns SP of one end of the first layer L1. For example, the bit line BL may be directly connected to the first impurity regions SD1. For another example, the bit line BL may be electrically connected through metal silicide to the first impurity regions SD1. The above detailed description of the first layer L1 may also be substantially identically applicable to the second and third layers L2 and L3.

The substrate SUB may be provided thereon with gate electrodes GE that penetrate the stack structure SS. The gate electrodes GE may have linear or pillar shapes extending in the third direction D3. The gate electrodes GE may be arranged in the first direction D1. When viewed in plan, the semiconductor patterns SP may be stacked between a pair of gate electrodes GE. Each of the gate electrodes GE may vertically extend on sidewalls of a plurality of semiconductor patterns SP that are vertically stacked.

For example, a first pair of the gate electrodes GE may be adjacent to a first one of the semiconductor patterns SP of the first layer L1, to a first one of the semiconductor patterns SP of the second layer L2, and to a first one of the semiconductor patterns SP of the third layer L3. A second pair of the gate electrodes GE may be adjacent to a second one of the semiconductor patterns SP of the first layer L1, to a second one of the semiconductor patterns SP of the second layer L2, and to a second one of the semiconductor patterns SP of the third layer L3.

The gate electrode GE may be adjacent to the channel region CH of the semiconductor pattern SP. The gate electrode GE may be provided on a sidewall of the channel region CH and may extend in the third direction D3. A gate dielectric layer GI may be interposed between the gate electrode GE and the channel region CH. The gate dielectric layer GI may include a high-k dielectric layer, a silicon oxide layer, a silicon nitride layer, a silicon oxynitride layer, or a combination thereof. For example, the high-k dielectric layer may include one or more of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and lead zinc niobate.

The gate electrodes GE may include a conductive material, where the conductive material may be one of a doped semiconductor material, a conductive metal nitride material, a metallic material, and a metal-semiconductor compound. The gate electrodes GE may correspond to the word lines WL discussed with reference to FIG. 1.

The substrate SUB may be provided thereon with a dielectric structure ISS that extends in the first direction D1 along one lateral surface of the stack structure SS. The dielectric structure ISS may be in contact with other ends of the semiconductor patterns SP. The dielectric structure ISS may include one or more of a silicon oxide layer, a silicon nitride layer, and a silicon oxynitride layer.

Although not shown, a dielectric material may fill empty spaces in the stack structure SS. For example, the dielectric material may include one or more of a silicon oxide layer, a silicon nitride layer, and a silicon oxynitride layer.

Figure 3:
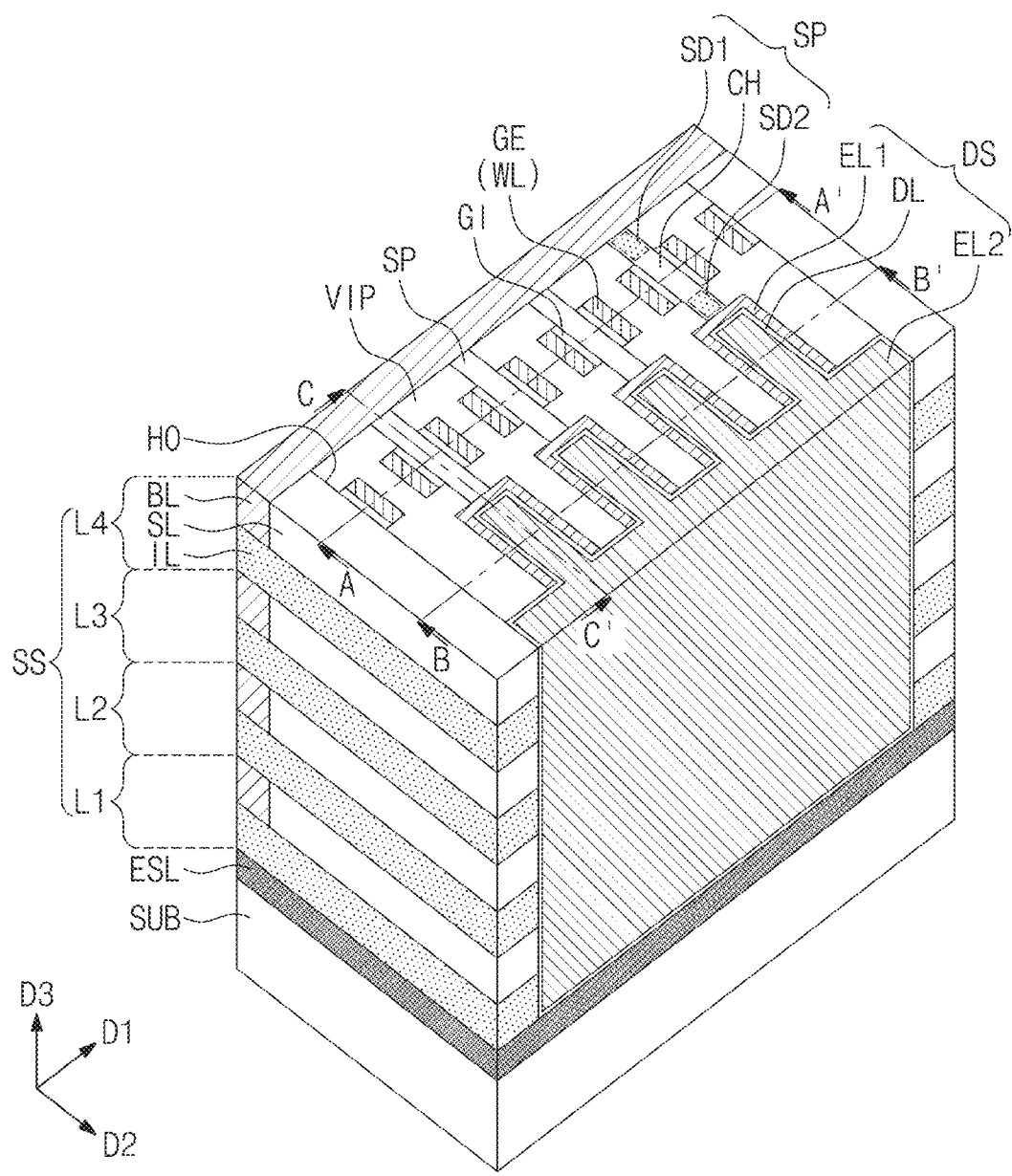
FIG. 3 illustrates a perspective view showing a three-dimensional semiconductor memory device according to some example embodiments of inventive concepts.
Figure 4B:
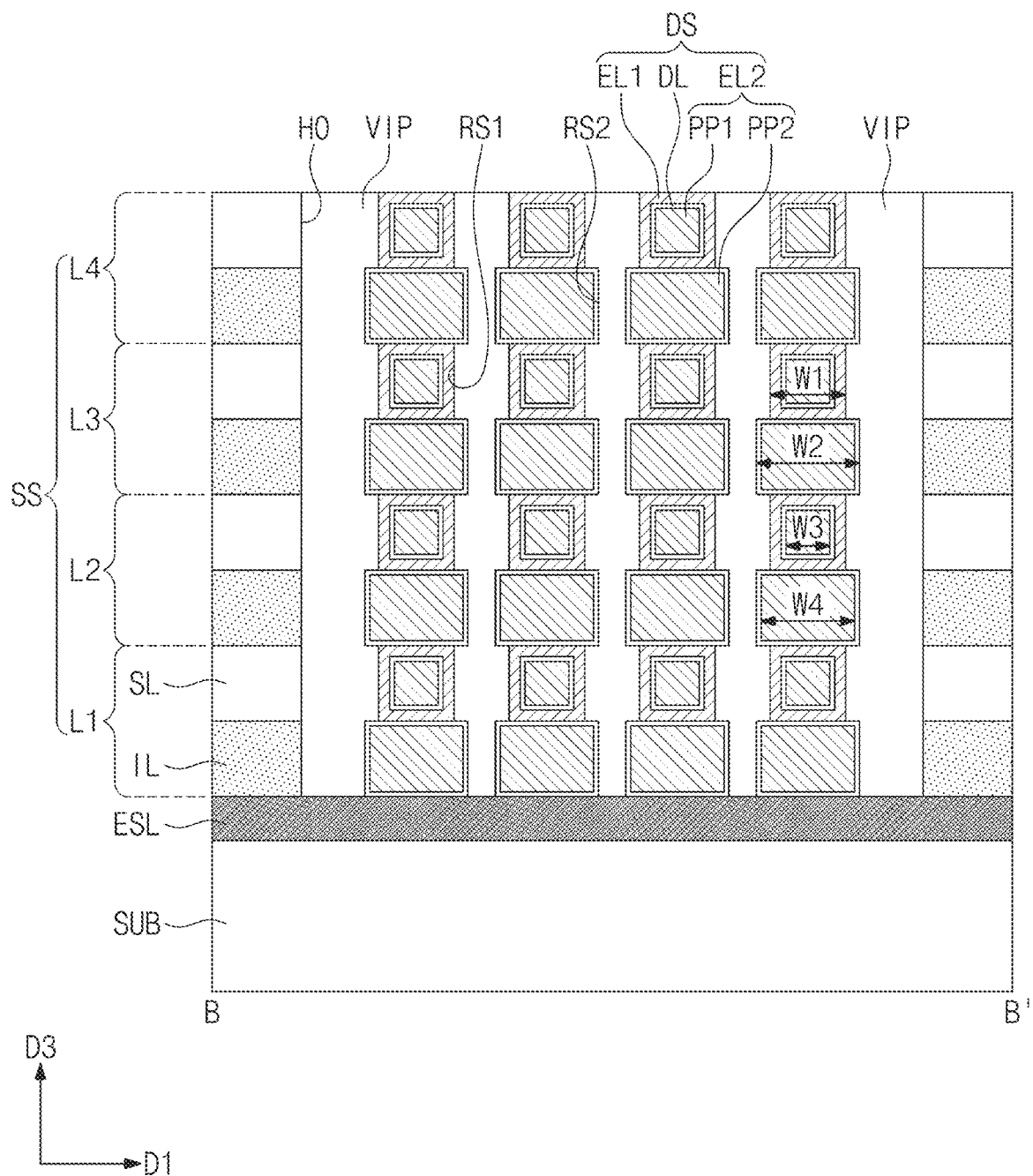
Figure 4C:
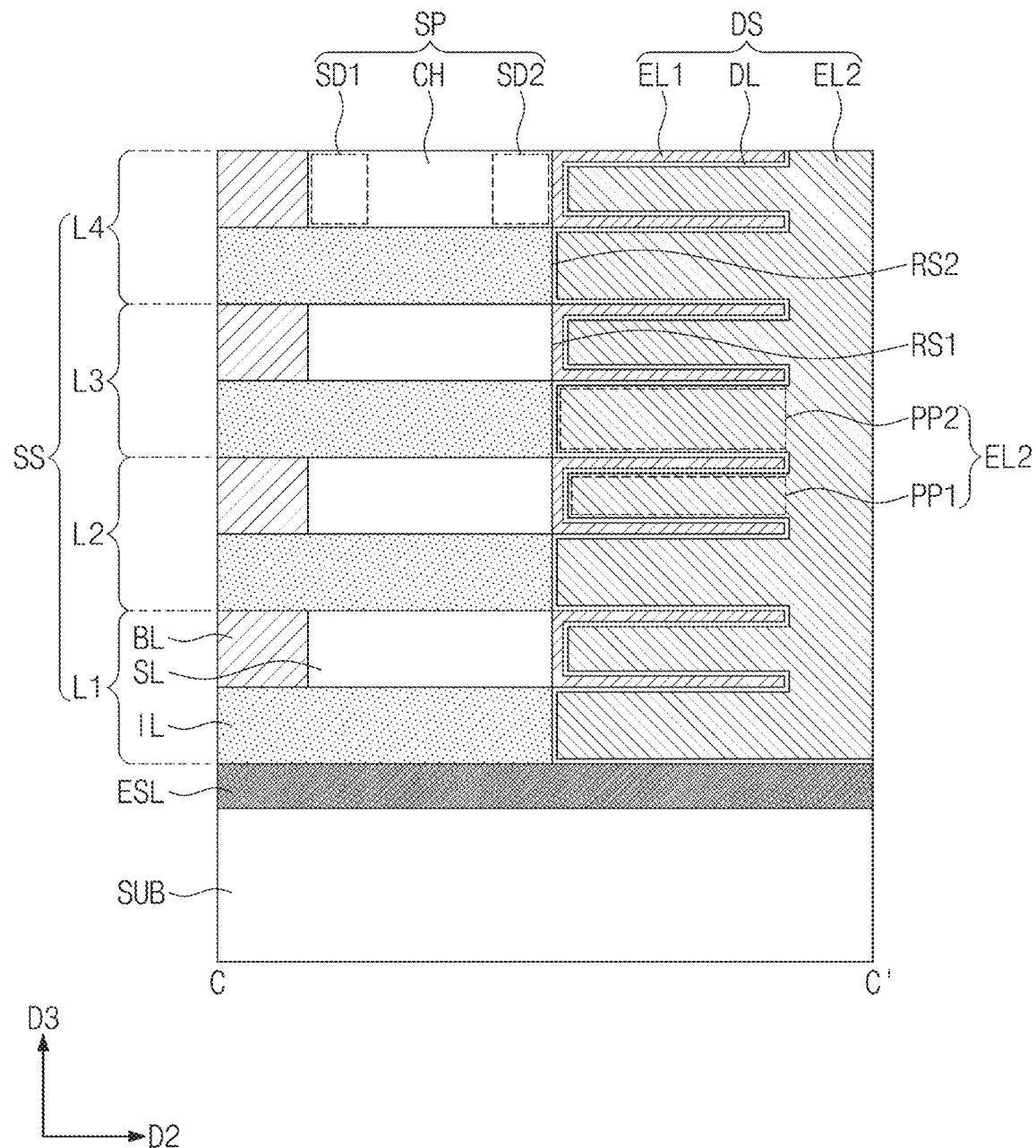

FIG. 3 illustrates a perspective view showing a three-dimensional semiconductor memory device according to some example embodiments of inventive concepts. FIGS. 4A, 4B, and 4C illustrate cross-sectional views respectively taken along lines A-A', B-B', and C-C' of FIG. 3. In the embodiment that follows, a detailed description of technical features repetitive to those discussed above with reference to FIGS. 1 and 2 will be omitted, and a difference thereof will be discussed in detail.

Referring to FIGS. 3 and 4A to 4C, a stack structure SS may be provided on a substrate SUB. The stack structure SS may extend in a first direction D1. Although not shown, the stack structure SS may be provided in plural, and the plurality of stack structures SS may be arranged in a second direction D2.

The stack structure SS may include first, second, third, and fourth layers L1, L2, L3, and L4 that are sequentially stacked on the substrate SUB. Each of the first, second, third, and fourth layers L1, L2, L3, and L4 may include an insulating layer IL, a semiconductor layer SL, and a bit line BL. The stack structure SS may further include an etch stop layer ESL interposed between the substrate SUB and the first layer L1. The first, second, third, and fourth layers L1, L2, L3, and L4 are examples according to some example embodiments of inventive concepts, and one or more additional layers may be stacked on the fourth layer L4.

The semiconductor layer SL and the bit line BL may be provided on the insulating layer IL. The semiconductor layer SL and the bit line BL may be disposed in parallel to each other on the insulating layer IL. The insulating layer IL may vertically (e.g., in a third direction D3) separate the semiconductor layer SL and the bit line BL on an upper layer from the semiconductor layer SL and the bit line BL on a lower layer.

The bit line BL of each of the first, second, third, and fourth layers L1, L2, L3, and L4 may extend in the first direction D1. The bit line BL may be located at the same level as that of the semiconductor layer SL. One sidewall of the bit line BL may face one sidewall of the semiconductor layer SL. One sidewall of the bit line BL may contact one sidewall of the semiconductor layer SL.

The semiconductor layer SL may include a semiconductor material, such as silicon, germanium, or silicon-germanium. The insulating layer IL may include one of a silicon oxide layer, a silicon nitride layer, a silicon oxynitride layer, a carbon-containing silicon oxide layer, a carbon-containing silicon nitride layer, and a carbon-containing silicon oxynitride layer. For example, the insulating layer IL may be a silicon nitride layer (e.g., SiN).

The semiconductor layer SL of each of the first, second, third, and fourth layers L1, L2, L3, and L4 may include a plurality of semiconductor patterns SP. Each of the semiconductor patterns SP may have a bar shape that extends in the second direction D2 from the bit line BL. Each of the semiconductor patterns SP may include a channel region CH, a first impurity region SD1, and a second impurity region SD2. The channel region CH may be interposed between the first and second impurity regions SD1 and SD2. The bit line BL may be electrically connected to the first impurity region SD1 of the semiconductor pattern SP.

Holes HO may be defined to penetrate the stack structure SS. The hole HO may be positioned between the semiconductor patterns SP. Gate electrodes GE may be provided to extend in a vertical direction (e.g., the third direction D3) in the hole HO that penetrates the stack structure SS. For example, the gate electrodes GE may penetrate the stack structure SS.

The gate electrodes GE may include a first gate electrode GE1 and a second gate electrode GE2 on opposite sides of the channel region CH of the semiconductor pattern SP. For example, the first and second gate electrodes GE1 and GE2 may constitute a single word line WL. For another example, the first gate electrode GE1 may be a word line WL, and the second gate electrode GE2 may be a back gate.

A gate dielectric layer GI may be interposed between each of the gate electrodes GE and each of the semiconductor patterns SP. The gate dielectric layer GI may include a high-k dielectric layer, a silicon oxide layer, a silicon nitride layer, a silicon oxynitride layer, or a combination thereof.

A vertical insulating layer VIP may be provided to fill the holes HO. The vertical insulating layer VIP may cover the gate electrodes GE. For example, the vertical insulating layer VIP may be interposed between a pair of gate electrodes GE that are adjacent to each other in the hole HO. The vertical insulating layer VIP may be interposed between a pair of semiconductor patterns SP that are adjacent to each other. The vertical insulating layer VIP may include one or more of a silicon oxide layer, a silicon nitride layer, and a silicon oxynitride layer. For example, the vertical insulating layer VIP may include a silicon oxide layer having an etch selectivity with respect to the insulating layer IL.

Data storage elements DS may be provided to have electrical connection with corresponding semiconductor patterns SP. Each of the data storage elements DS may include a first electrode EL1, a dielectric layer DL, and a second electrode EL2. The data storage elements DS in the stack structure SS may share one dielectric layer DL and one second electrode EL2. For example, a plurality of first electrodes EL1 may be provided in the stack structure SS, and one dielectric layer DL may cover surfaces of the first electrodes EL1 One second electrode EL2 may be provided on one dielectric layer DL.

The data storage element DS according to inventive concepts will be further discussed in detail below with reference again to FIGS. 4B and 4C.

The vertical insulating layer VIP may include first recesses RS1 and second recesses RS2. For example, four first recesses RS1 may be defined on each of the first, second, third, and fourth layers L1, L2, L3, and L4, and four second recesses RS2 may be defined on each of the first, second, third, and fourth layers L1, L2, L3, and L4. The first recess RS1 may be located at the same level as that of the semiconductor layer SL. The second recess RS2 may be located at the same level as that of the insulating layer IL.

The first recess RS1 may expose one end of the semiconductor pattern SP. The first recess RS1 may extend in the second direction D2 from the one end of the semiconductor pattern SP. The second recess RS2 may be interposed between a pair of the first recesses RS1 that are vertically adjacent to each other. The second recess RS2 may extend in the second direction D2. A first width W1 may be given as a maximum width in the first direction D1 of the first recess RS1. A second width W2 may be given as a maximum width in the first direction D1 of the second recess RS2. The second width W2 may be greater than the first width W1.

The first electrodes EL1 may be correspondingly provided in the first recesses RS1. The first electrodes EL1 may be correspondingly connected to the second impurity regions SD2 of the semiconductor patterns SP. Each of the first electrodes EL1 may have a cylindrical shape whose one end is opened. For example, the first electrode EL1 may include a first segment that has connection with the second impurity region SD2 and a second segment that extends in the second direction D2 from the first segment. The first electrode EL1 may extend in the second direction D2 along the first recess RS1. The first width W1 may be given as a maximum width in the first direction D1 of the first electrode ELL The second electrode EL2 may include a plurality of protrusions PP1 and PP2. The protrusions PP1 and PP2 may include a first protrusion PP1 provided in the first recess RS1 and a second protrusion PP2 provided in the second recess RS2. The first protrusion PP1 may protrude from the second electrode EL2 toward the semiconductor pattern SP. The first protrusion PP1 may be provided in a cylinder of the first electrode ELL The first protrusion PP1 may extend along the second direction D2 in the cylinder of the first electrode ELL The second protrusion PP2 may protrude from the second electrode EL2 toward the insulating layer IL. The second protrusion PP2 may extend in the second direction D2 along the second recess RS2.

A third width W3 may be given as a maximum width in the first direction D1 of the first protrusion PP1. A fourth width W4 may be given as a maximum width in the first direction D1 of the second protrusion PP2. The fourth width W4 may be greater than the third width W3.

According to some example embodiments of inventive concepts, the first and second electrodes EL1 and EL2 may be provided in the first and second recesses RS1 and RS2 formed in the vertical insulating layer VIP. Referring to FIG. 4C, the first electrodes EL1 and the first and second protrusions PP1 and PP2 of the second electrode EL2 may each have an elongated shape in the second direction D2. Therefore, the first electrodes EL1 and the first and second protrusions PP1 and PP2 may be in danger of collapse when no supporters are provided thereto. Referring to FIG. 4B, the vertical insulating layer VIP may serve as a supporter that supports the first and second electrodes EL1 and EL2 that are stacked. The vertical insulating layer VIP may physically connect to each other a plurality of first electrodes EL1 that are stacked in the third direction D3. In conclusion, a semiconductor device according to some example embodiments of inventive concepts may limit and/or prevent process defects and improve its reliability.

FIGS. 5, 7, 9, 11, 13, 15, and 17 illustrate plan views showing a method of fabricating a three-dimensional semiconductor memory device according to some example embodiments of inventive concepts. FIGS. 6, 8, 10A, 12A, 14A, 16A, and 18A illustrate cross-sectional views taken along line A-A' of FIGS. 5, 7, 9, 11, 13, 15, and 17, respectively. FIGS. 10B, 12B, 14B, 16B, and 18B illustrate cross-sectional views taken along line B-B' of FIGS. 9, 11, 13, 15, and 17, respectively.

Figure 5:
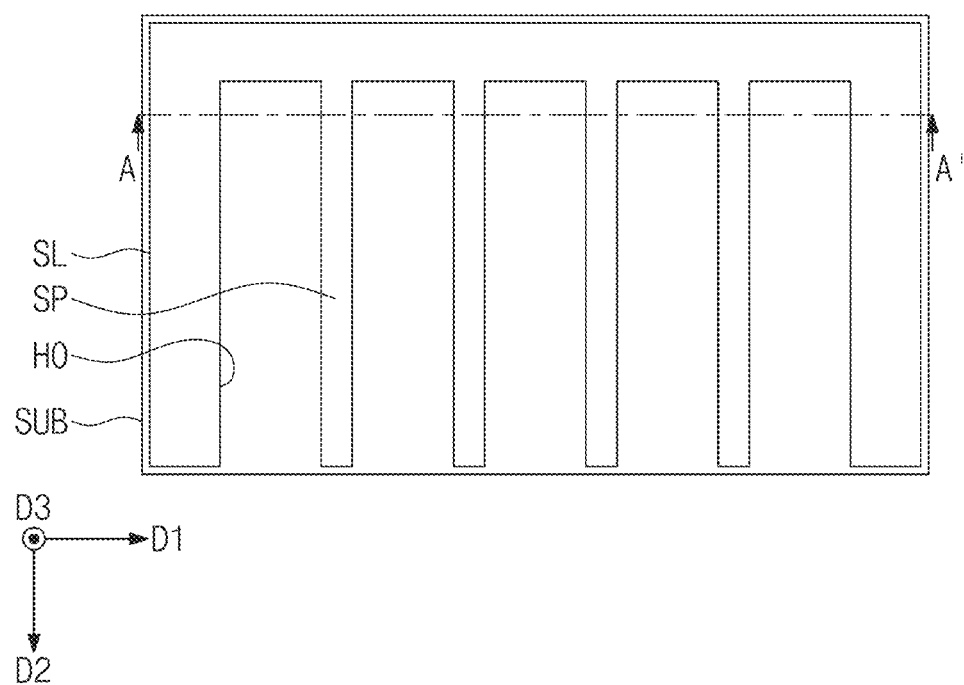
Figure 6:
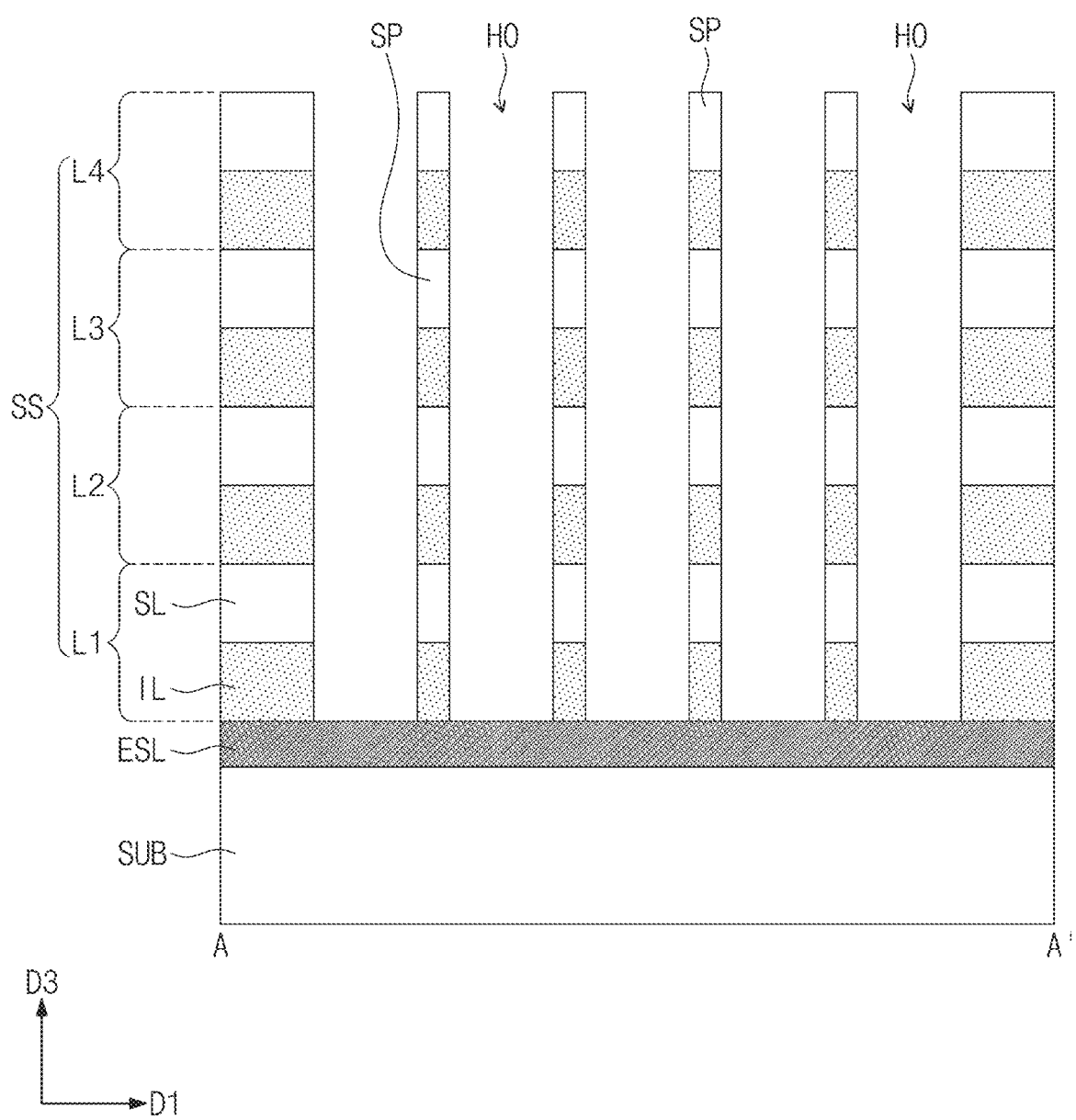
FIGS. 6, 8, 10A, 12A, 14A, 16A, and 18A illustrate cross-sectional views taken along line A-A' of FIGS. 5, 7, 9, 11, 13, 15, and 17, respectively.

Referring to FIGS. 5 and 6, an etch stop layer ESL may be formed on a substrate SUB. A stack structure SS may be formed on the etch stop layer ESL. The formation of the stack structure SS may include forming first, second, third, and fourth layers L1, L2, L3, and L4 that are sequentially stacked.

Each of the first, second, third, and fourth layers L1, L2, L3, and L4 may include an insulating layer IL and a semiconductor layer SL. The insulating layer IL and the semiconductor layer SL may be sequentially formed. The semiconductor layer SL may include a semiconductor material, such as silicon, germanium, or silicon-germanium. The insulating layer IL may include one of a silicon oxide layer, a silicon nitride layer, a silicon oxynitride layer, a carbon-containing silicon oxide layer, a carbon-containing silicon nitride layer, and a carbon-containing silicon oxynitride layer. For example, the insulating layer IL may be formed of a silicon nitride layer (e.g., SiN).

The stack structure SS may be patterned to form holes HO that penetrate the stack structure SS. The holes HO may not penetrate the etch stop layer ESL on the substrate SUB. The etch stop layer ESL may not allow the holes HO to expose a top surface of the substrate SUB and the holes HO may expose a top surface of the etch stop layer ESL.

Each of the holes HO may have a linear or bar shape that extends in a second direction D2. The holes HO may be arranged spaced apart from each other along a first direction D1. The holes HO may define semiconductor patterns SP on corresponding semiconductor layers SL. For example, the semiconductor pattern SP may be defined by a pair of neighboring holes HO.

Figure 7:
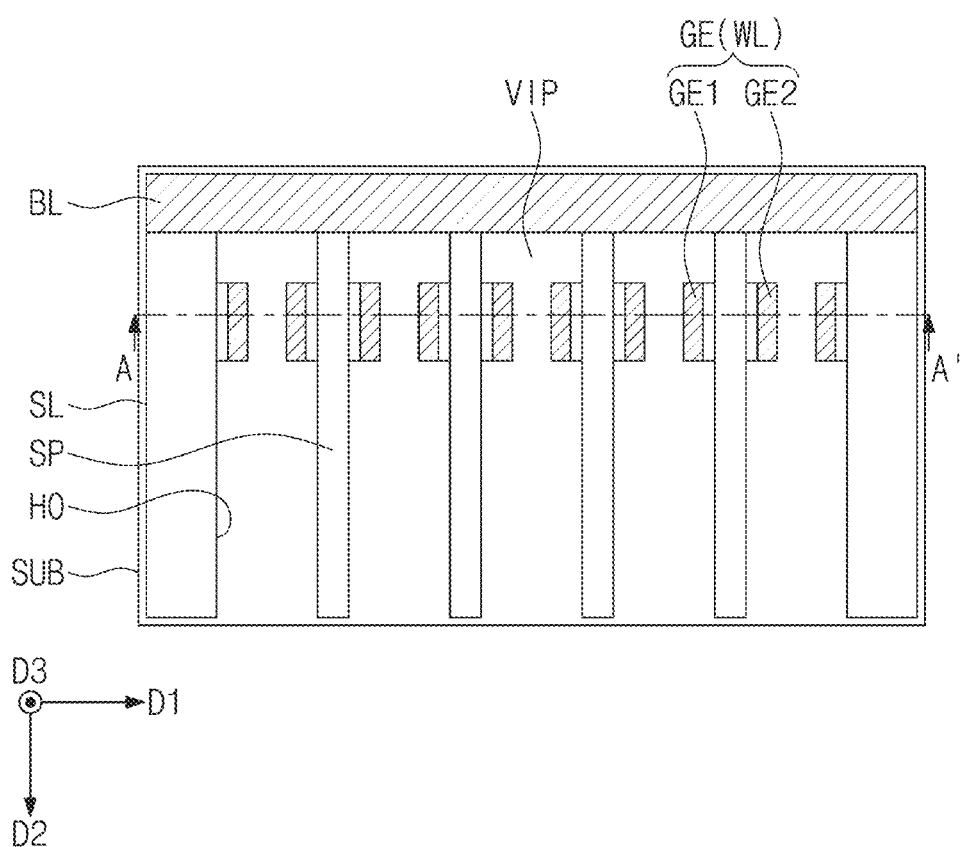
Figure 8:
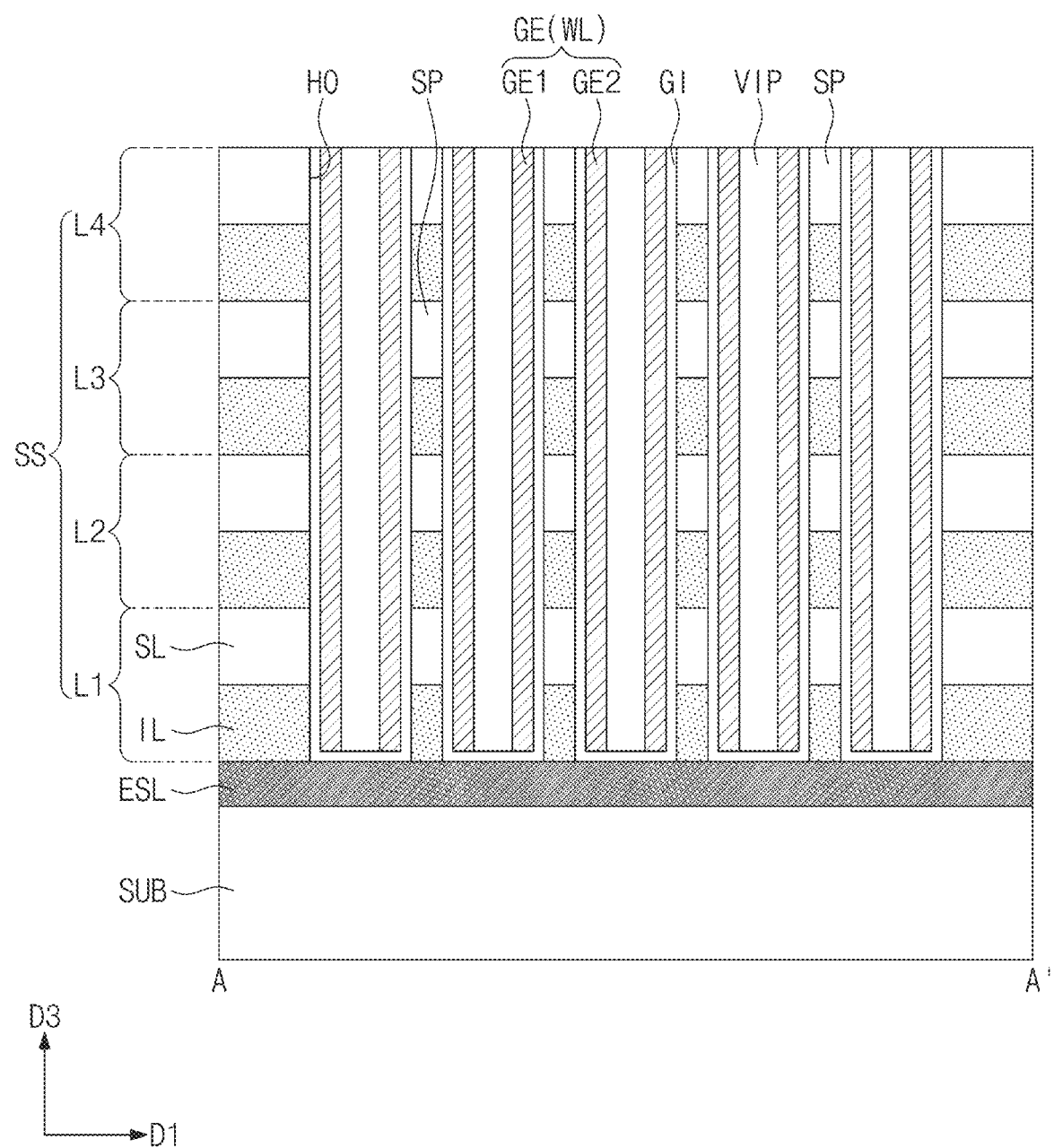

Referring to FIGS. 7 and 8, gate electrodes GE and gate dielectric layers GI may be formed in each of the holes HO. For example, a dielectric layer and a conductive layer may be formed in the holes HO and then patterned to form the gate dielectric layers GI and the gate electrodes GE. The stack structure SS may have an inner sidewall exposed to the hole HO, and the gate electrode GE and the gate dielectric layer GI may extend in a third direction D3 along the inner sidewall of the stack structure SS. The gate electrodes GE may include a first gate electrode GE1 and a second gate electrode GE2 provided on opposite sides of the semiconductor pattern SP.

After the formation of the gate electrodes GE, a vertical insulating layer VIP may be formed to fill the holes HO. The vertical insulating layer VIP may include one or more of a silicon oxide layer, a silicon nitride layer, and a silicon oxynitride layer. For example, the vertical insulating layer VIP may include a silicon oxide layer having an etch selectivity with respect to the insulating layer IL.

A portion of the semiconductor layer SL may be replaced with a bit line BL. For example, a wet etching process may be performed to selectively etch the semiconductor layer SL on one sidewall of the stack structure SS. The etching process may remove the portion of the semiconductor layer SL. A conductive material may be deposited on a location where the semiconductor layer SL is removed, and thus the bit line BL may be formed. The bit line BL may extend in the first direction D1. The bit line BL may be electrically connected to one end of each of the semiconductor patterns SP.

Figure 9:
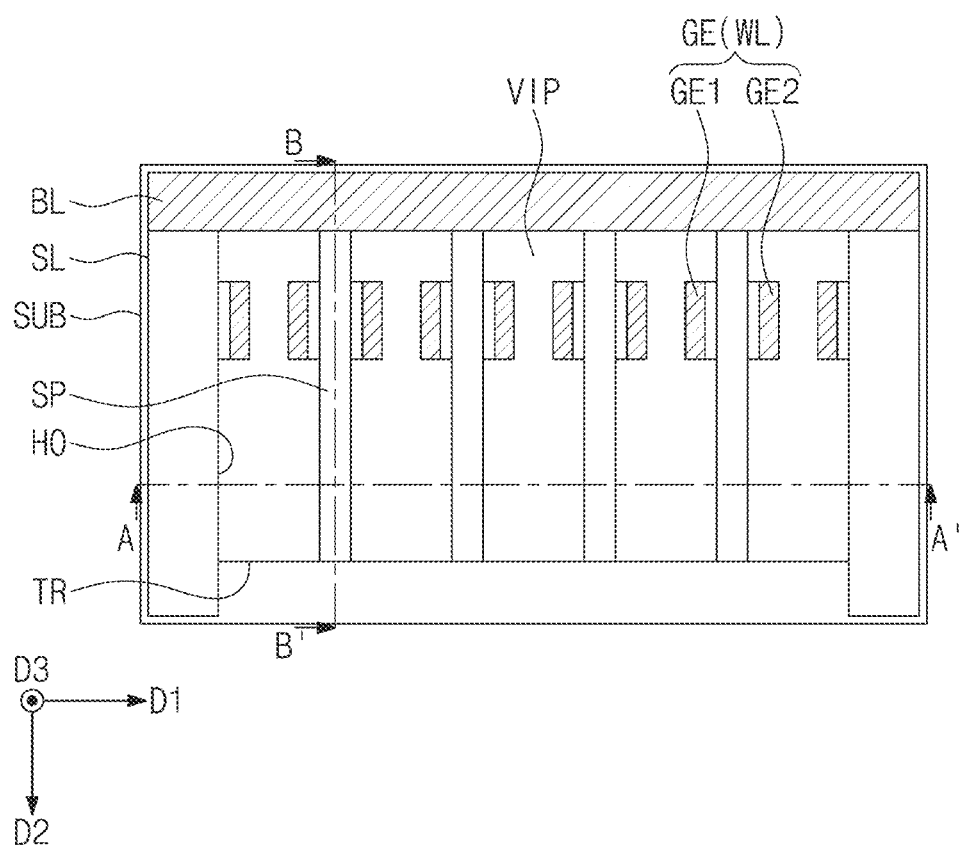
Figure 10A:
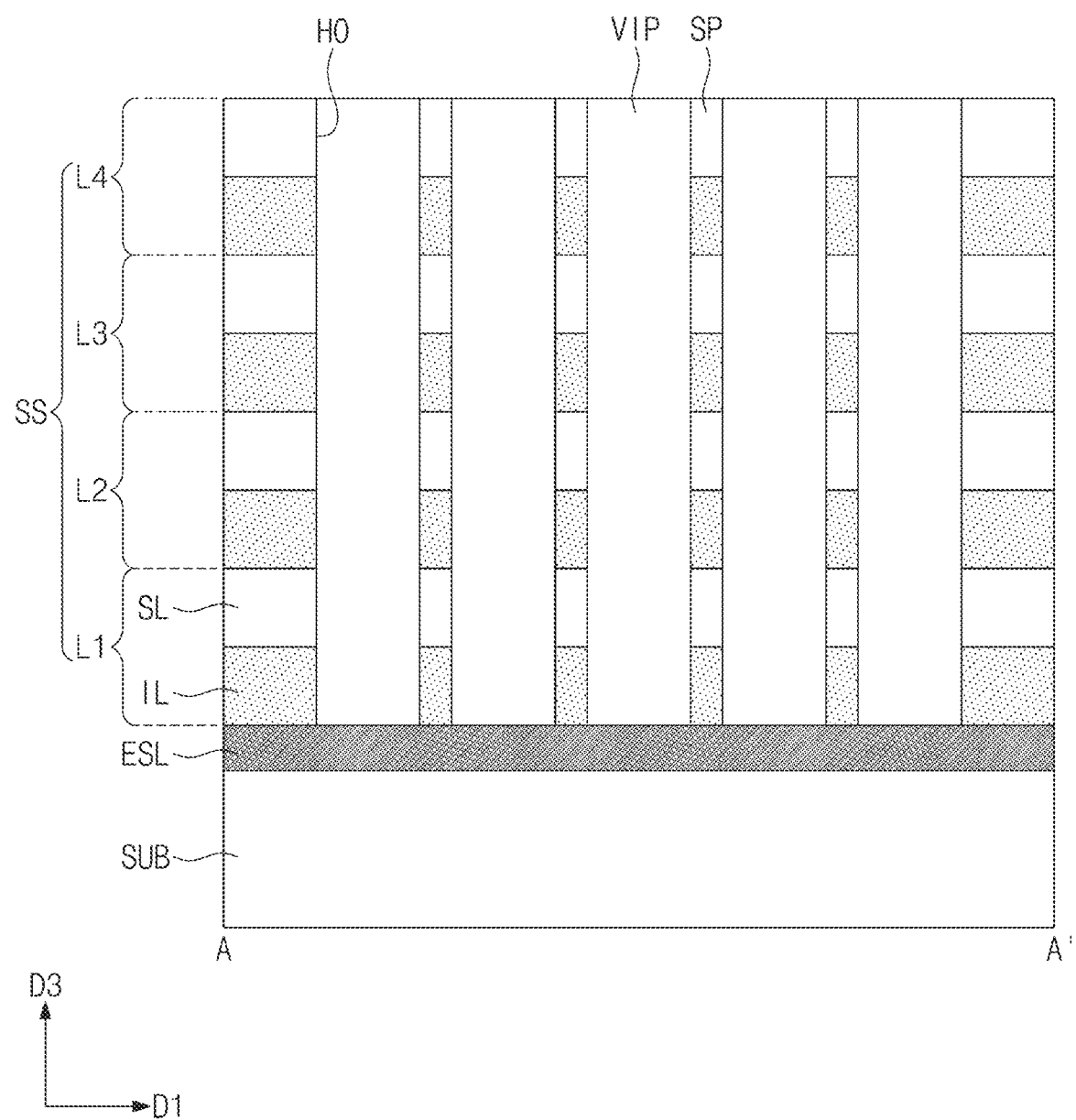
Figure 10B:
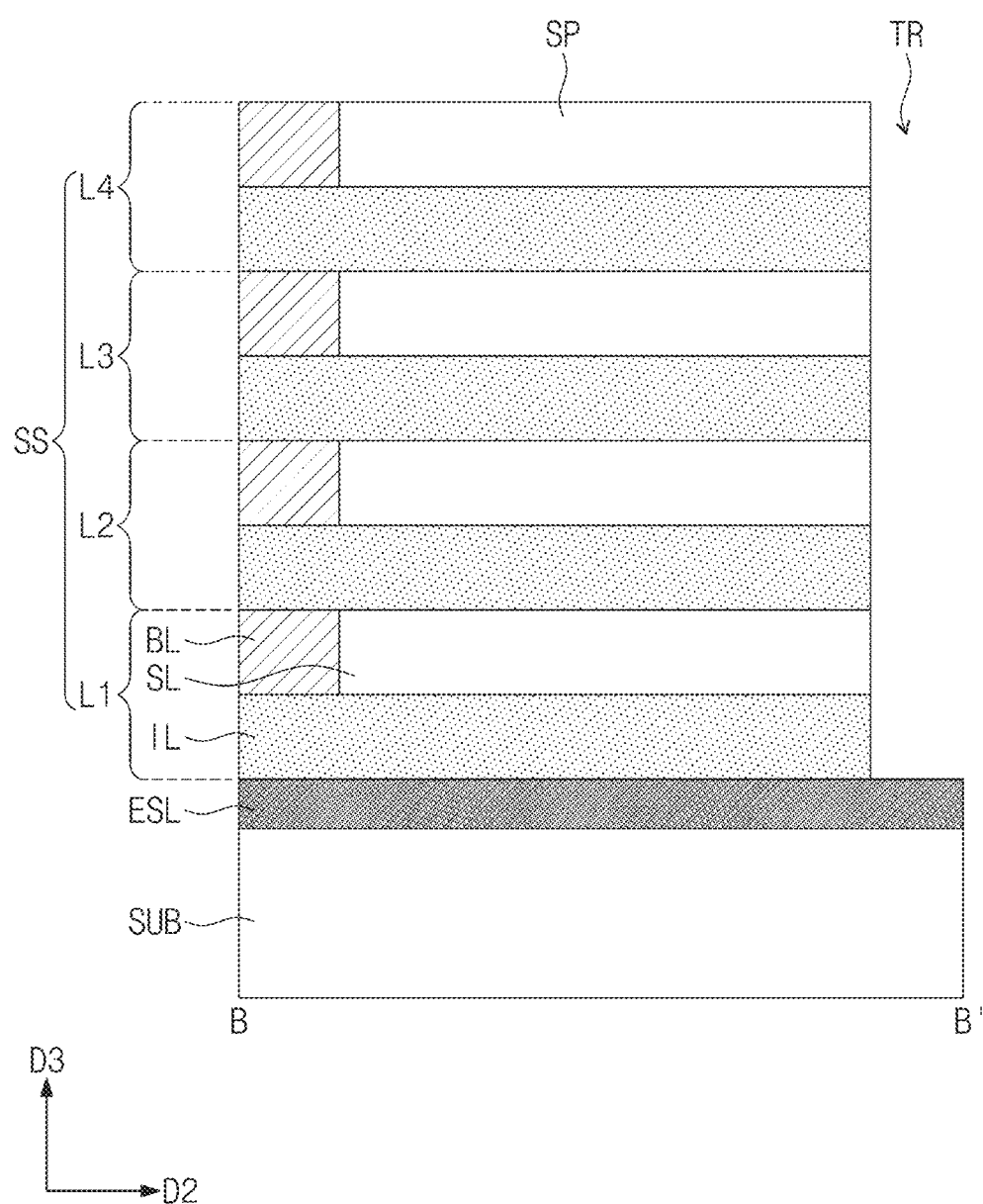
FIGS. 10B, 12B, 14B, 16B, and 18B illustrate cross-sectional views taken along line B-B' of FIGS. 9, 11, 13, 15, and 17, respectively.

Referring to FIGS. 9, 10A, and 10B, the stack structure SS may be patterned to form a trench TR that penetrates the stack structure SS. The trench TR may expose sidewalls of the semiconductor patterns SP, sidewalls of the insulting layers IL, and a sidewall of the vertical insulating layer VIP. The trench TR may extend in the first direction D1.

Figure 11:
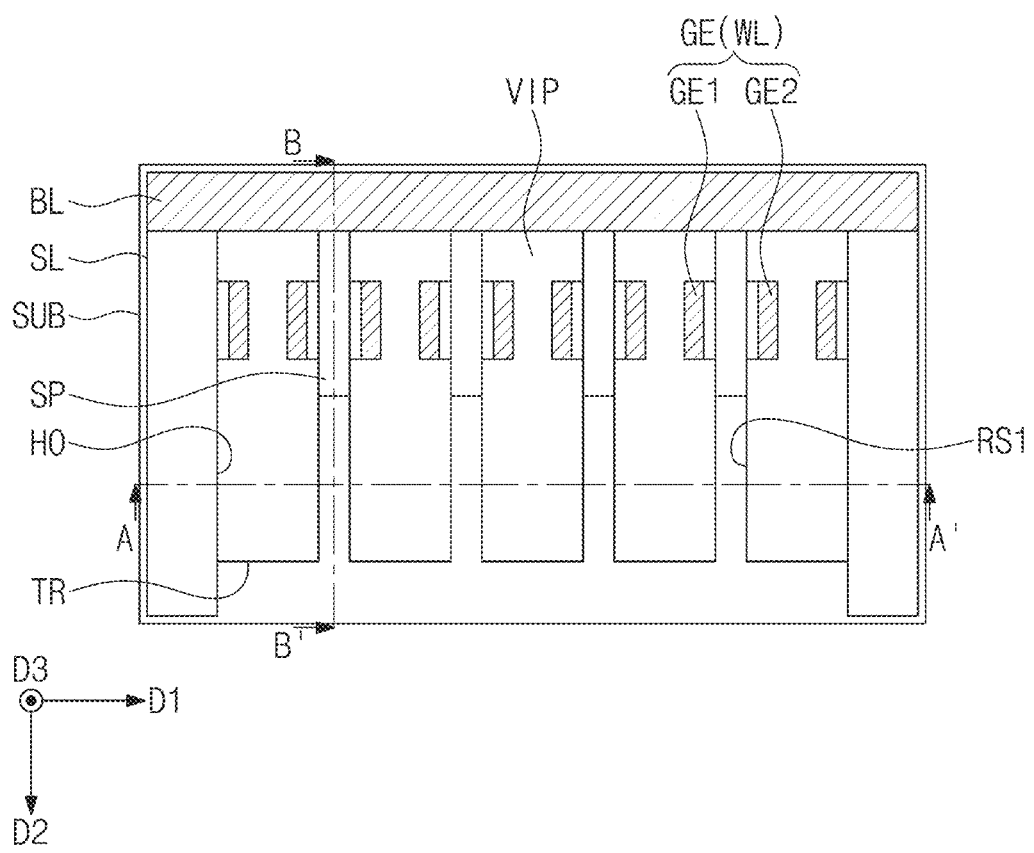
Figure 12A:
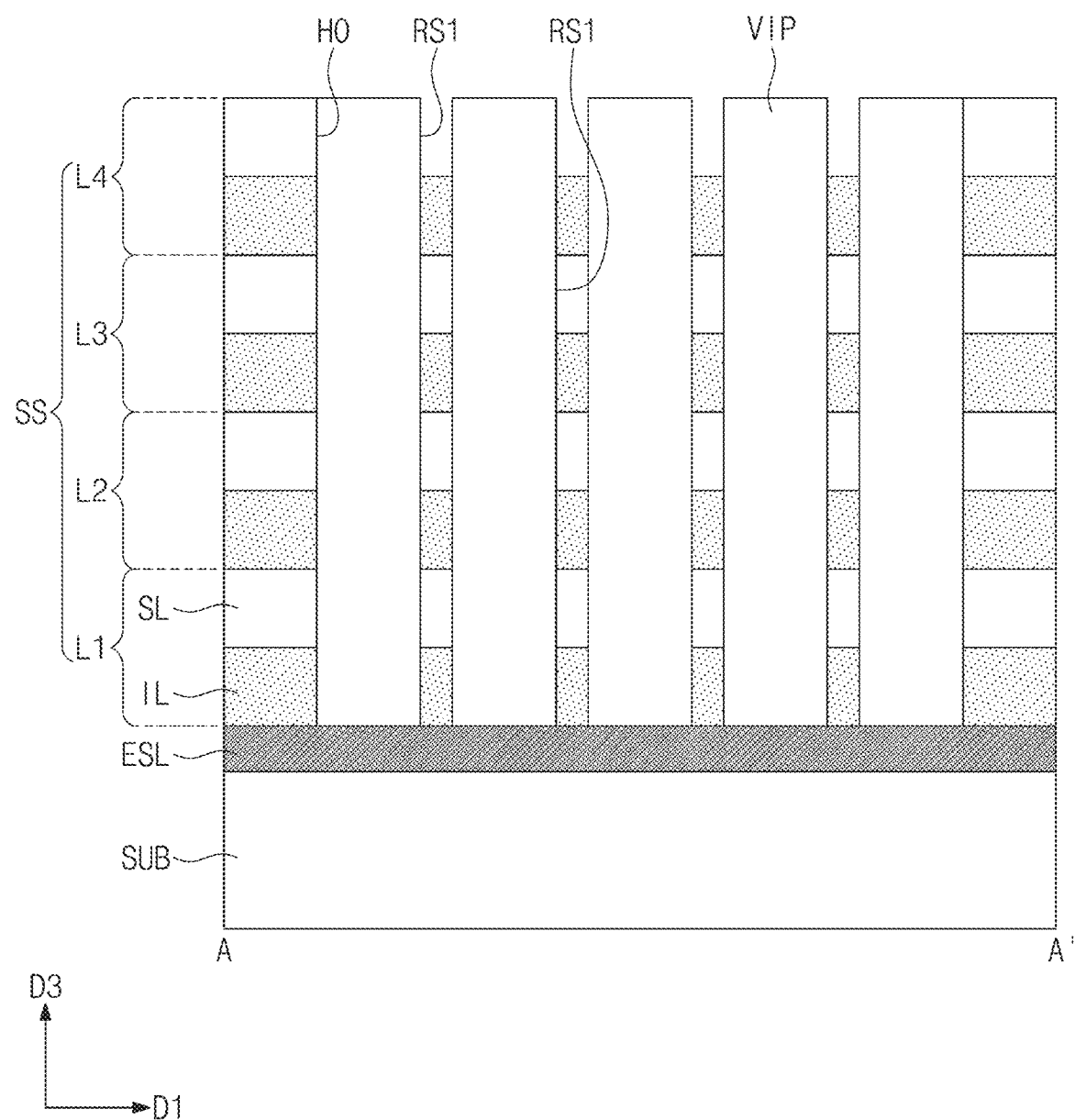
Figure 12B:
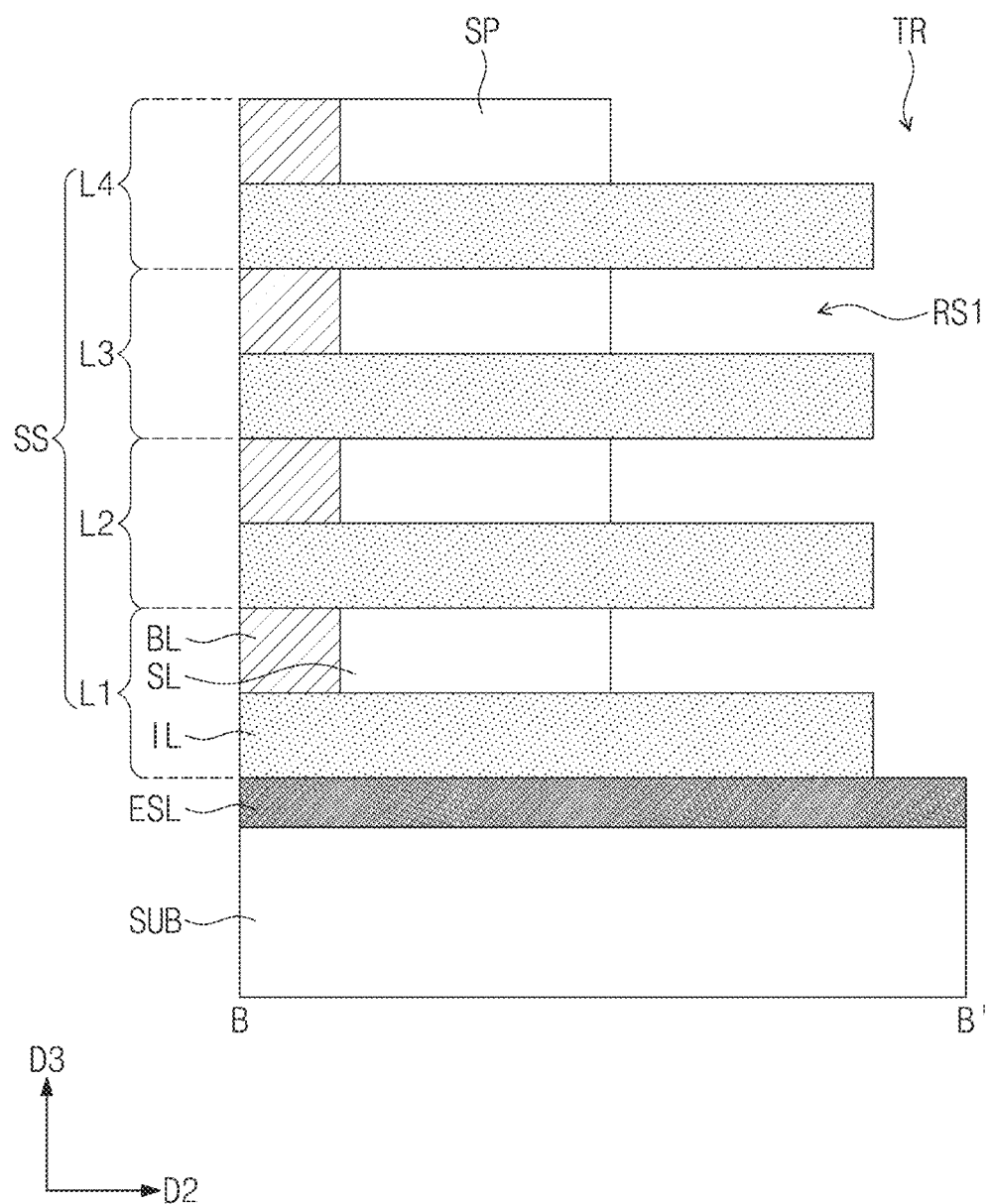

Referring to FIGS. 11, 12A, and 12B, the semiconductor patterns SP exposed to the trench TR may be selectively wet-etched to form first recesses RS1. The first recesses RS1 may horizontally extend from the trench TR toward the bit lines BL. A portion of the semiconductor pattern SP may be etched and removed, and a remaining portion of the semiconductor pattern SP may remain adjacent to the bit line BL. The first recess RS1 may be surrounded by the insulating layers IL and the vertical insulating layer VIP.

Figure 13:
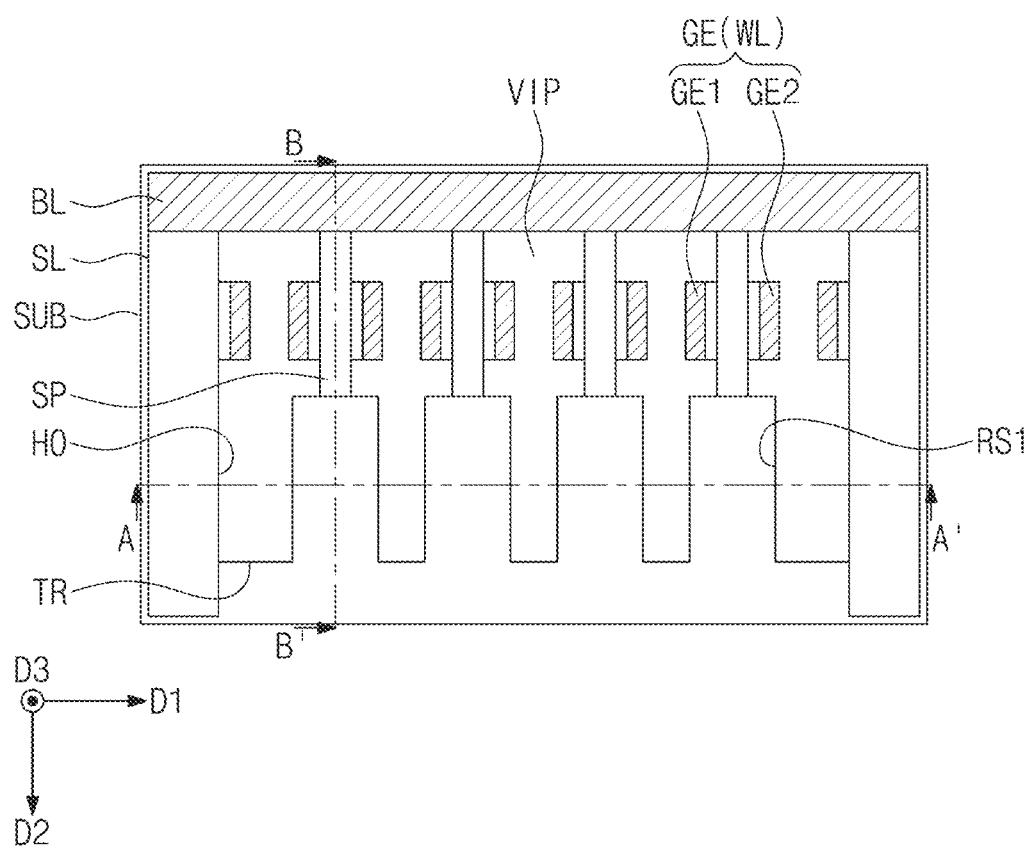
Figure 14A:
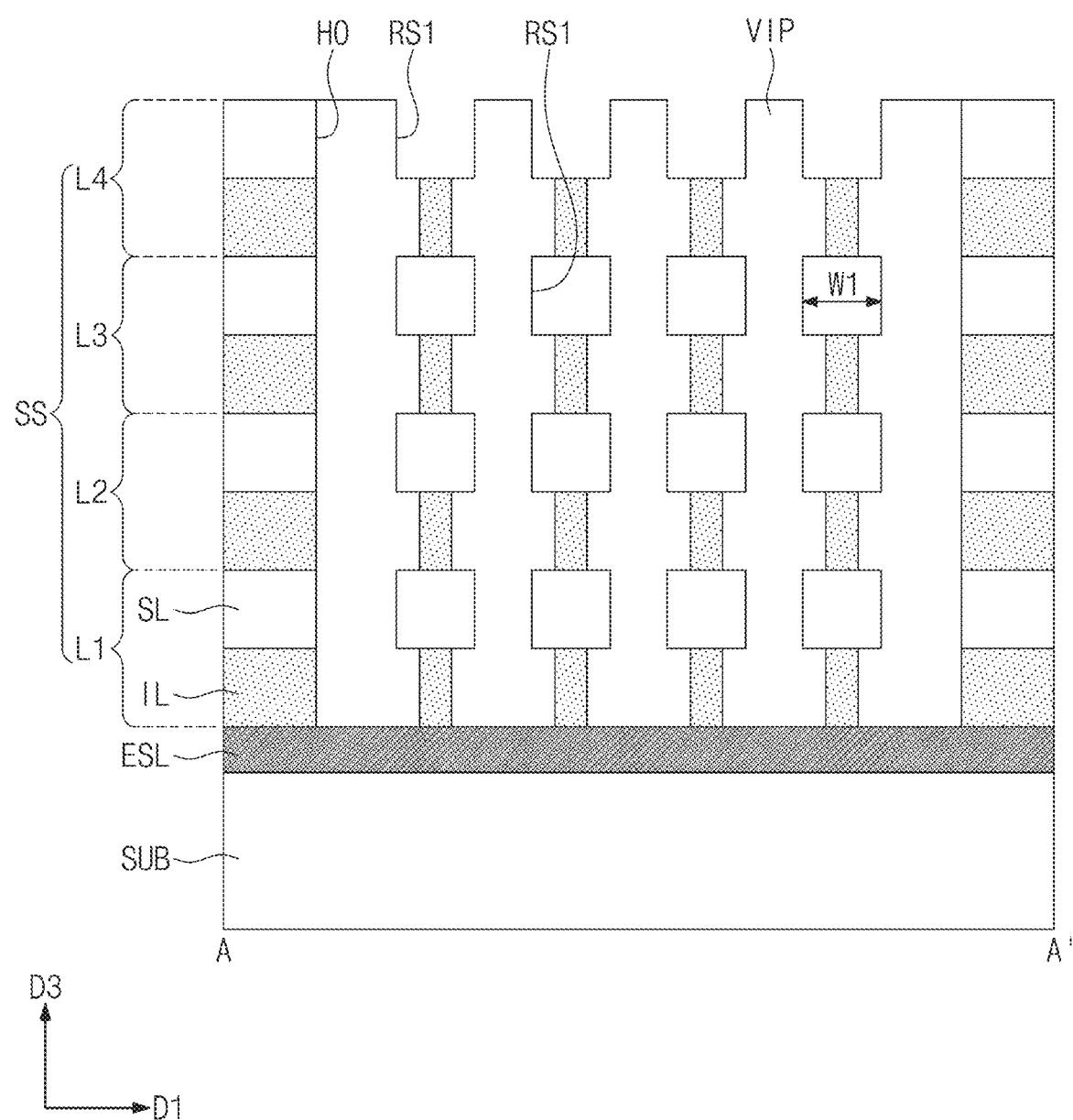
Figure 14B:
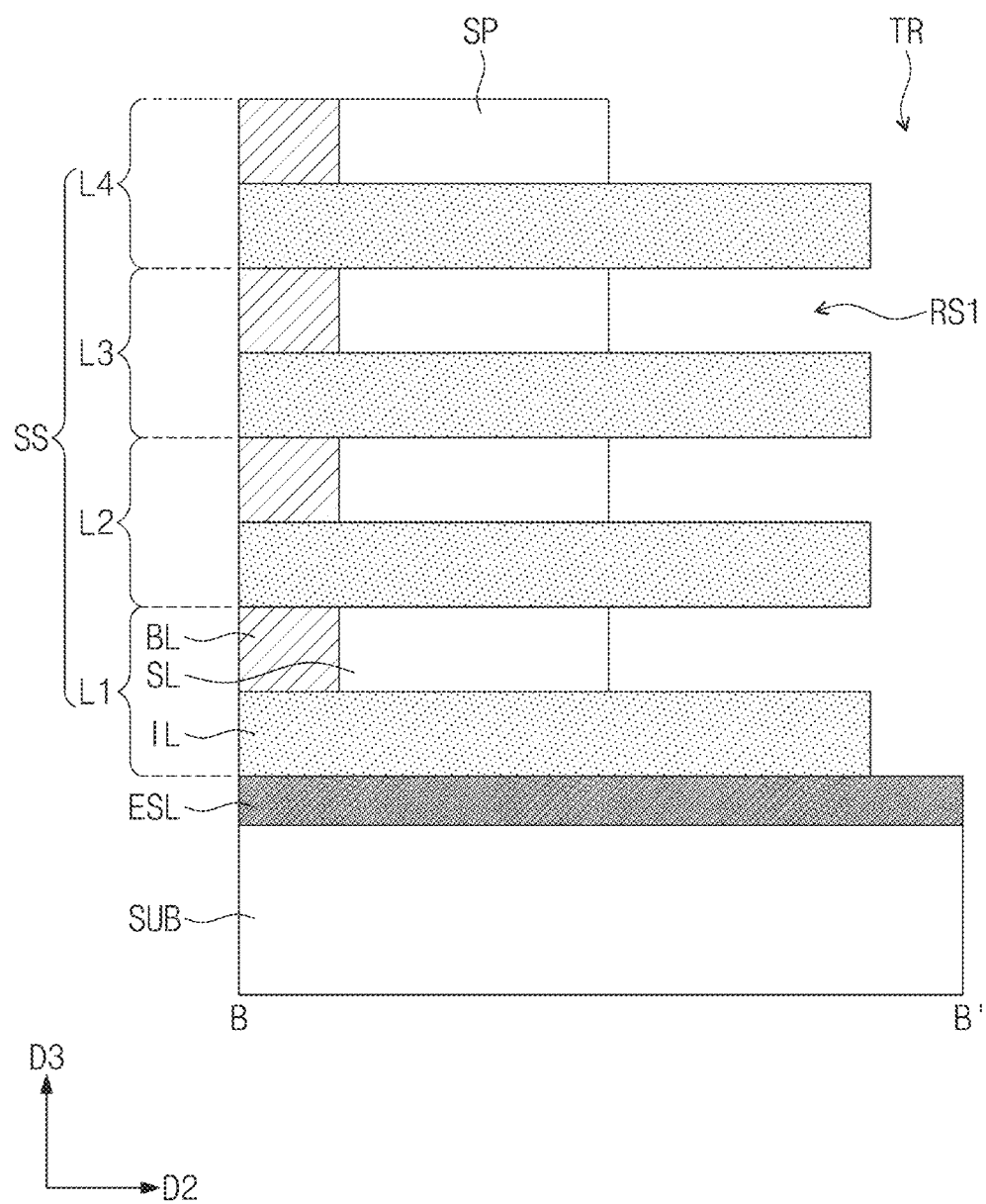

Referring to FIGS. 13, 14A, and 14B, the vertical insulating layer VIP may be selectively etched through the first recesses RS1, and thus the first recesses RS1 may expand in the first direction D1. Owing to the selective etching, the vertical insulating layer VIP may be removed at a portion adjacent to the first recesses RS1. The expansion may allow the first recess RS1 to have a first width W1 as a maximum width in the first direction D1.

Figure 16A:
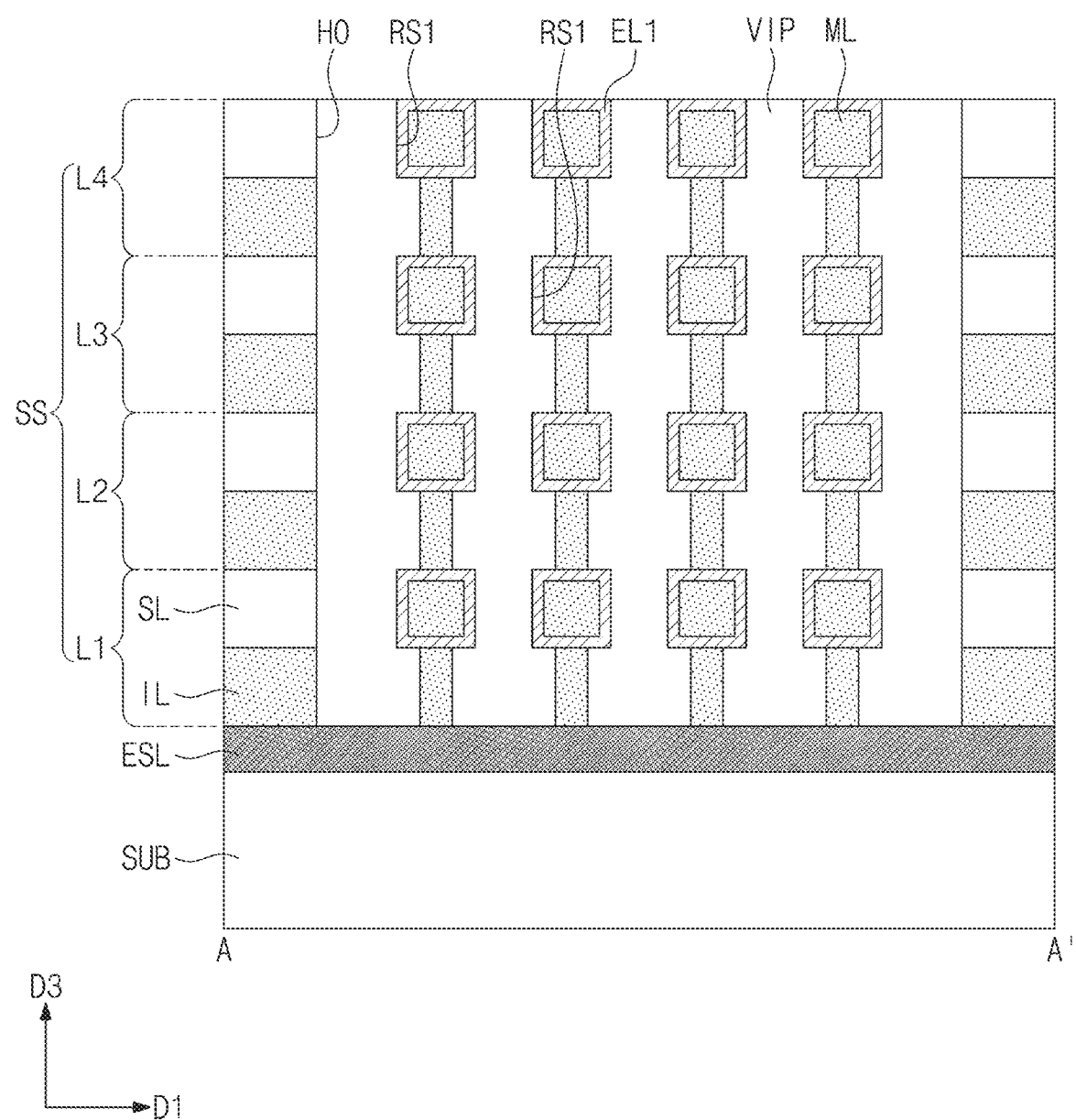
Figure 16B:
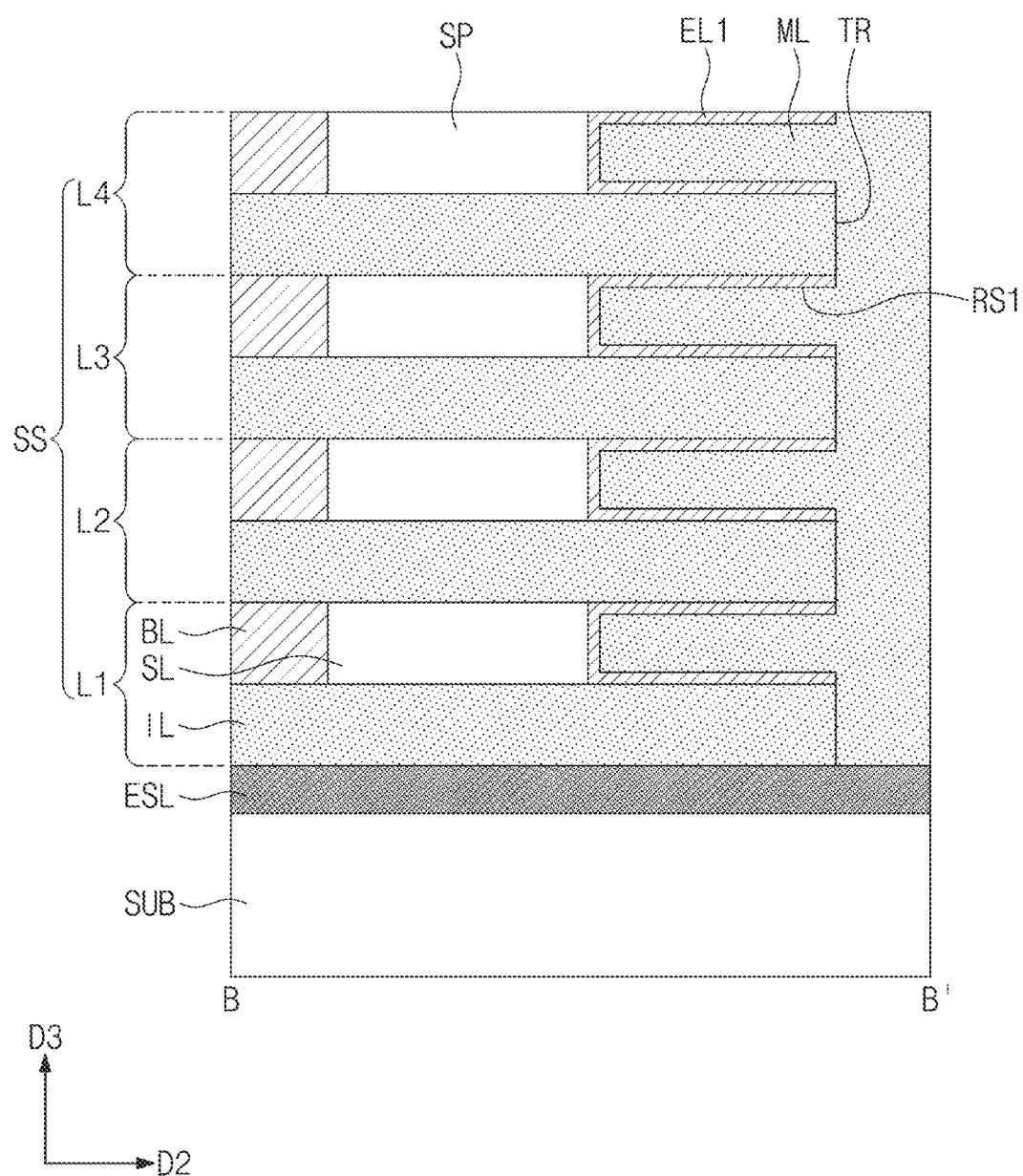

Referring to FIGS. 15, 16A, and 16B, first electrodes EL1 may be formed in corresponding first recesses RS1. For example, the formation of the first electrodes EL1 may include conformally forming a first electrode layer in the first recesses RS1, and performing a wet etching process in which the first electrode layer is separated into a plurality of first electrodes EL1. The first electrode EL1 may then have a cylindrical shape whose one end is opened.

A mold layer ML may be formed to completely fill the first recesses RS1. The mold layer ML may fill the trench TR. The mold layer ML may be formed of the same material as that of the insulating layers IL.

Figure 17:
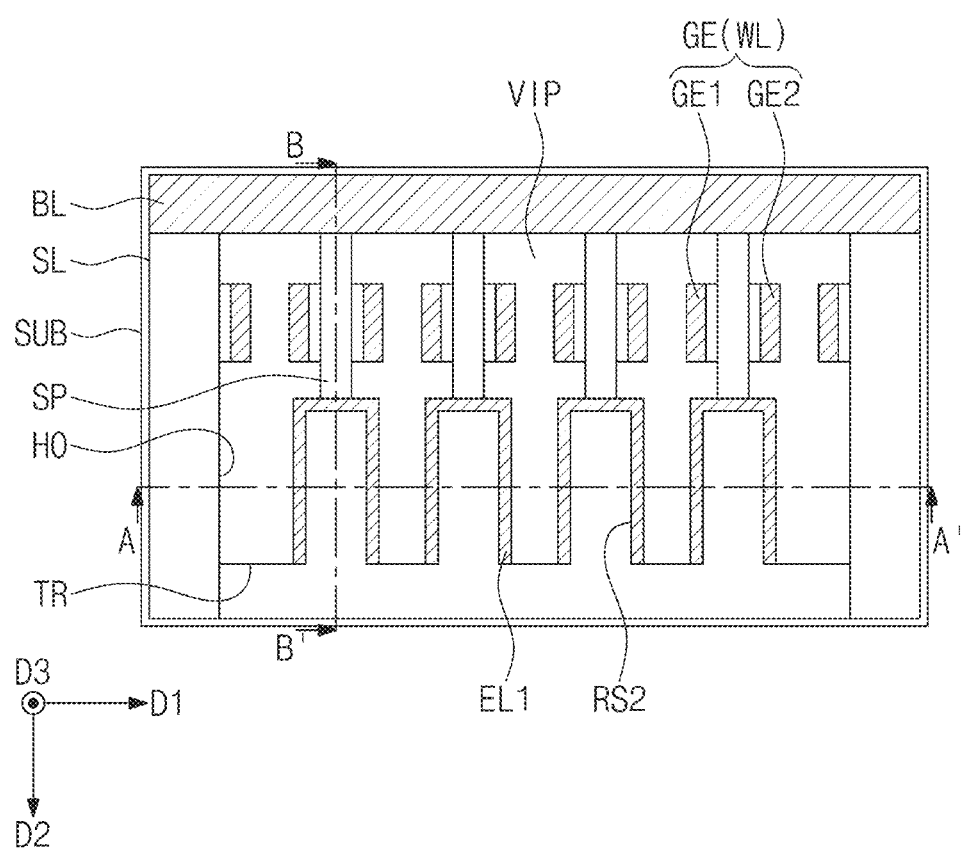
Figure 18A:
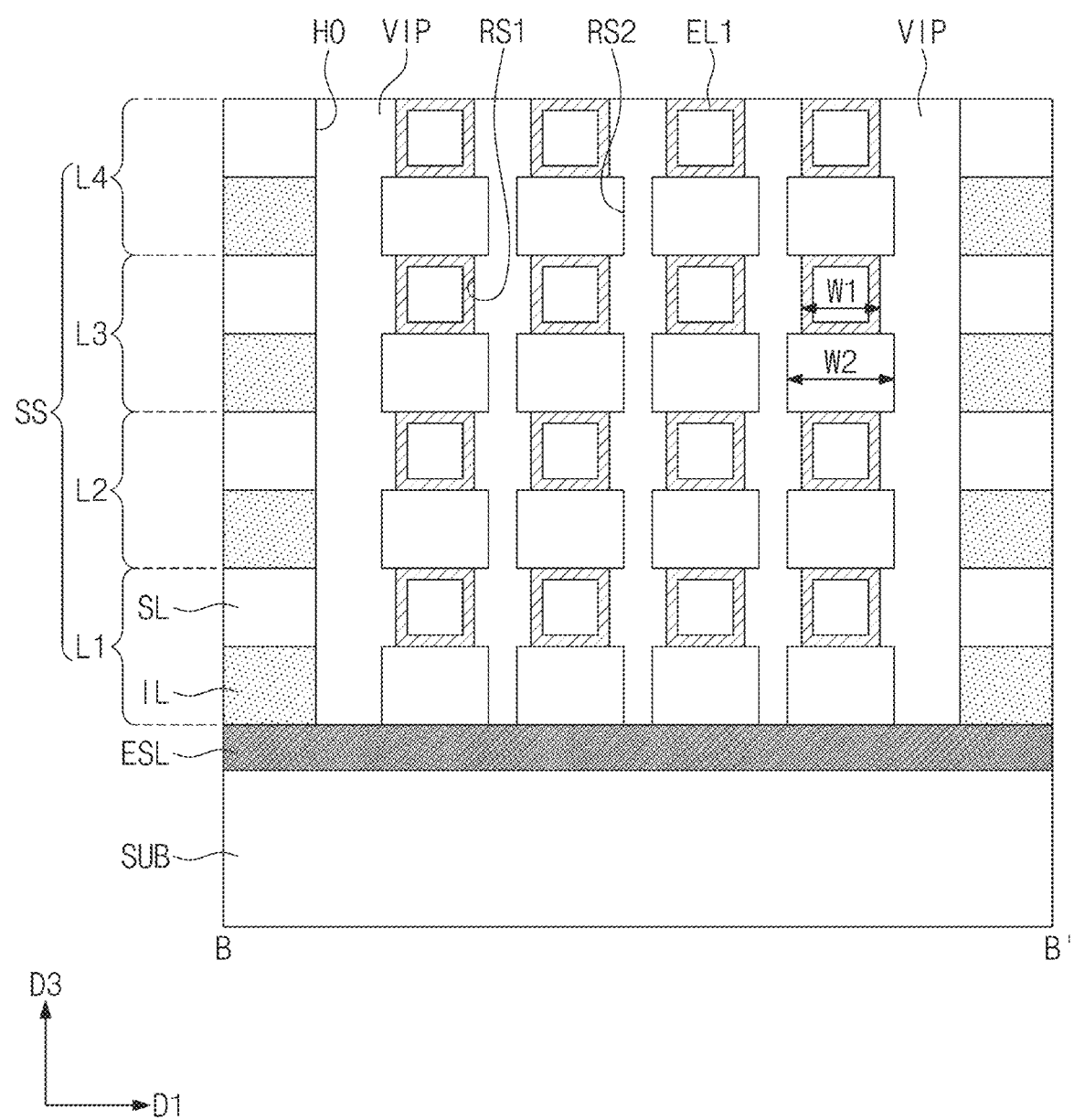
Figure 18B:
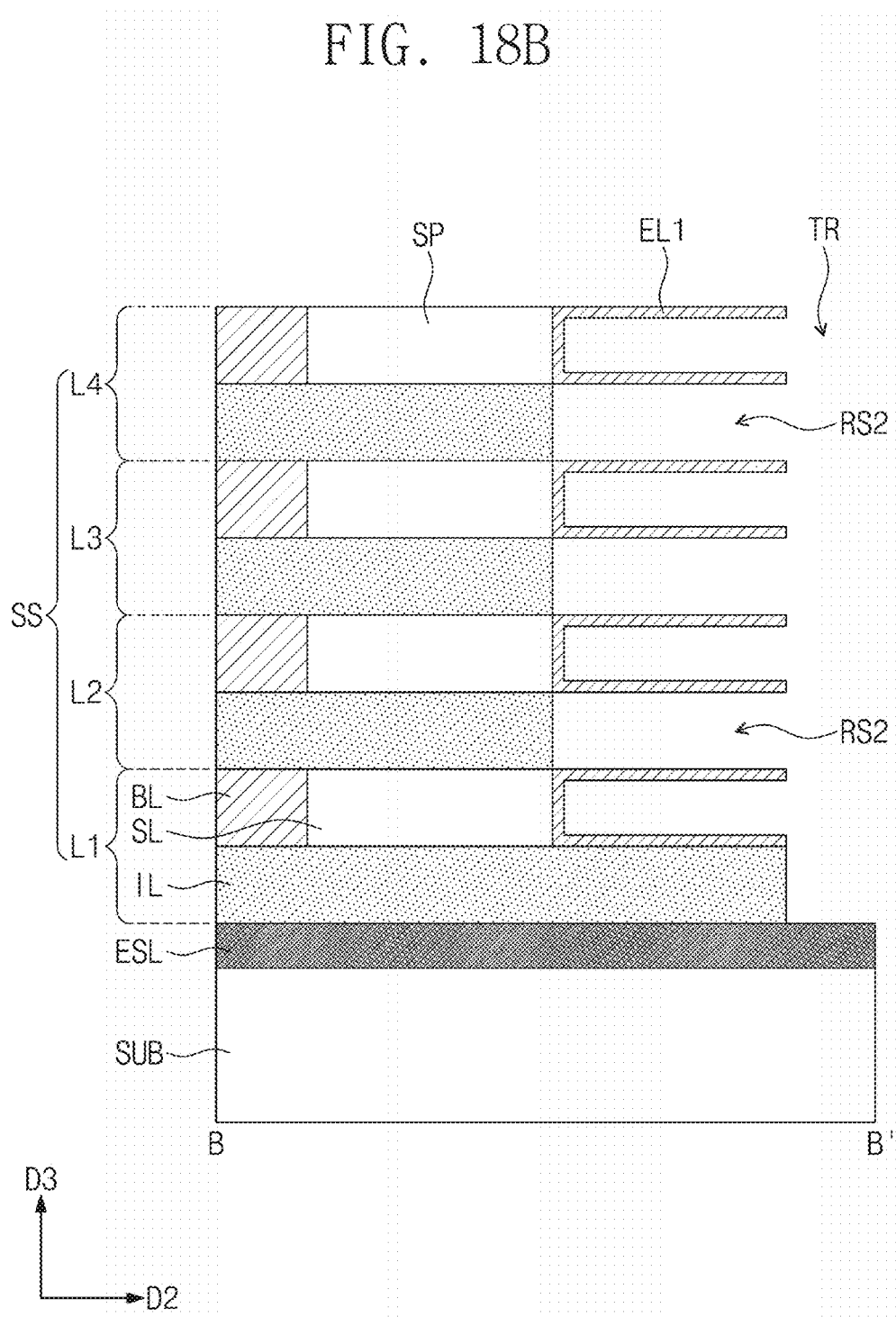

Referring to FIGS. 17, 18A, and 18B, a wet etching process may be performed to selectively wet-etch the mold layer ML and the insulating layers IL. Portions of the insulating layers IL may be removed to form second recesses RS2. The second recesses RS2 may horizontally extend from the trench TR toward remaining insulating layers IL.

The wet etching process may be executed until the second recesses RS2 expose the semiconductor patterns SP. The wet etching process may be fulfilled until the mold layer ML is completely removed from the cylinder of the first electrode EL1.

The vertical insulating layer VIP may be selectively etched through the second recesses RS2, and thus the second recesses RS2 may expand in the first direction D1. Owing to the selective etching, the vertical insulating layer VIP may be etched at a portion adjacent to the second recesses RS2. The expansion may allow the second recess RS2 to have a second width W2 as a maximum width in the first direction D1. The second recess RS2 may be formed such that its second width W2 becomes larger than the first width W1.

According to some example embodiment of inventive concepts, during the formation of the second recesses RS2, the vertical insulating layer VIP may support the first electrodes EL1. Accordingly, the first electrodes EL1 may be limited and/or prevented from collapsing toward the substrate SUB.

Referring back to FIGS. 3 and 4A to 4C, a dielectric layer DL may be conformally formed on the substrate SUB. The dielectric layer DL may cover an exposed surface of the first electrode EL1. For example, the dielectric layer DL may partially fill a cylindrical inner space of the first electrode EL1. The dielectric layer DL may partially fill the second recess RS2.

A second electrode EL2 may be formed to fill the trench TR and the first and second recesses RS1 and RS2. The second electrode EL2 may completely fill the first and second recesses RS1 and RS2. For example, the second electrode EL2 may include first protrusions PP1 that fill the first recesses RS1 and second protrusions PP2 that fill the second recesses RS2.

Figure 19:
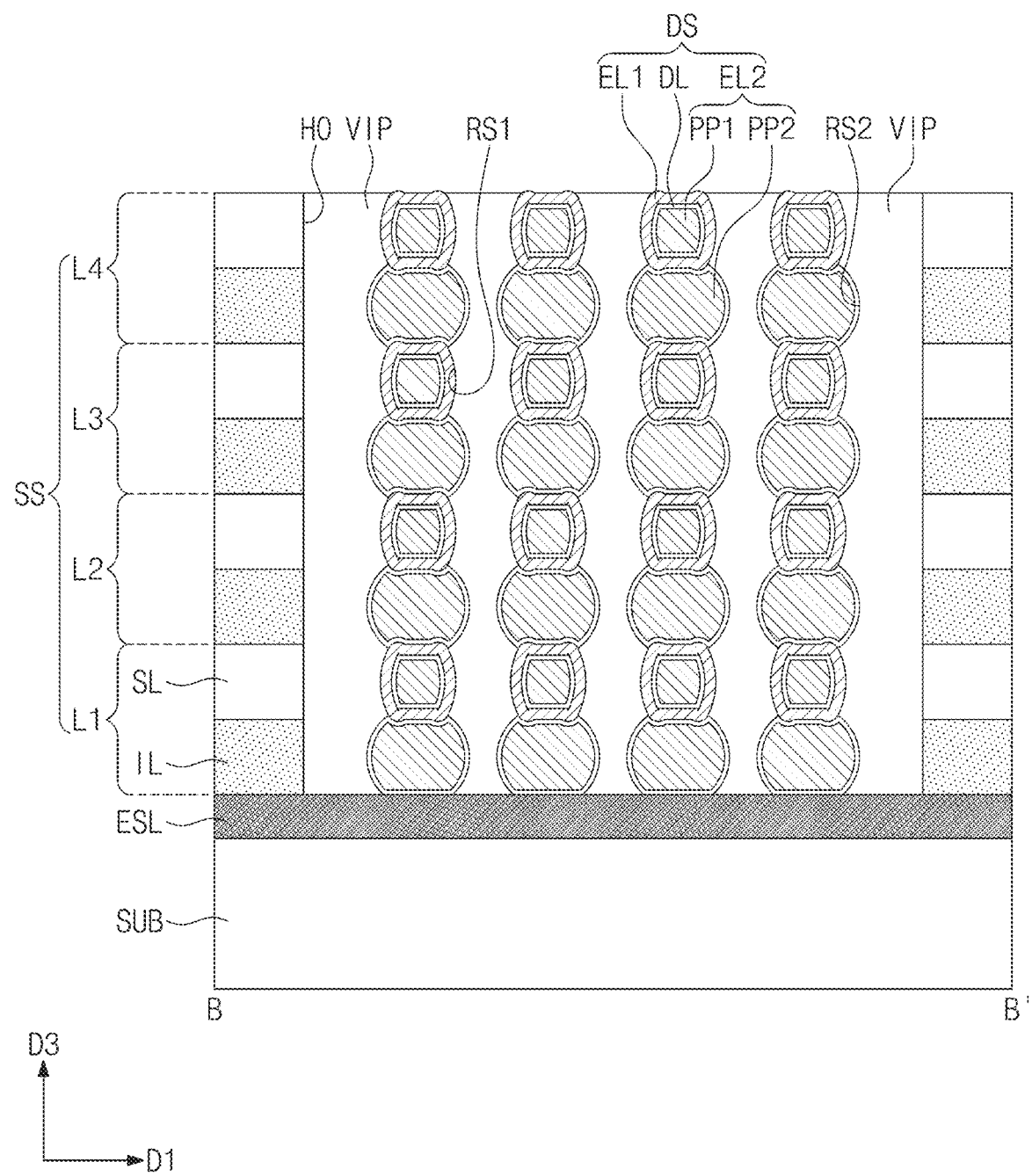
FIG. 19 illustrates a cross-sectional view taken along line B-B' of FIG. 3, showing a three-dimensional semiconductor memory device according to some example embodiments of inventive concepts.

FIG. 19 illustrates a cross-sectional view taken along line B-B' of FIG. 3, showing a three-dimensional semiconductor memory device according to some example embodiments of inventive concepts. In the embodiment that follows, a detailed description of technical features repetitive to those discussed above with reference to FIGS. 3 and 4A to 4C will be omitted, and a difference thereof will be discussed in detail.

Referring to FIGS. 3, 4A, 4C, and 19, the first recess RS1 may be curved at opposite sidewalls thereof. Therefore, the first electrode EL1 may have curved opposite sidewalls, and the first protrusion PP1 of the second electrode EL2 may have curved opposite sidewalls. The second recess RS2 may be curved at opposite sidewalls thereof. Therefore, the second protrusion PP2 of the second electrode EL2 may have curved opposite sidewalls.

Figure 20:
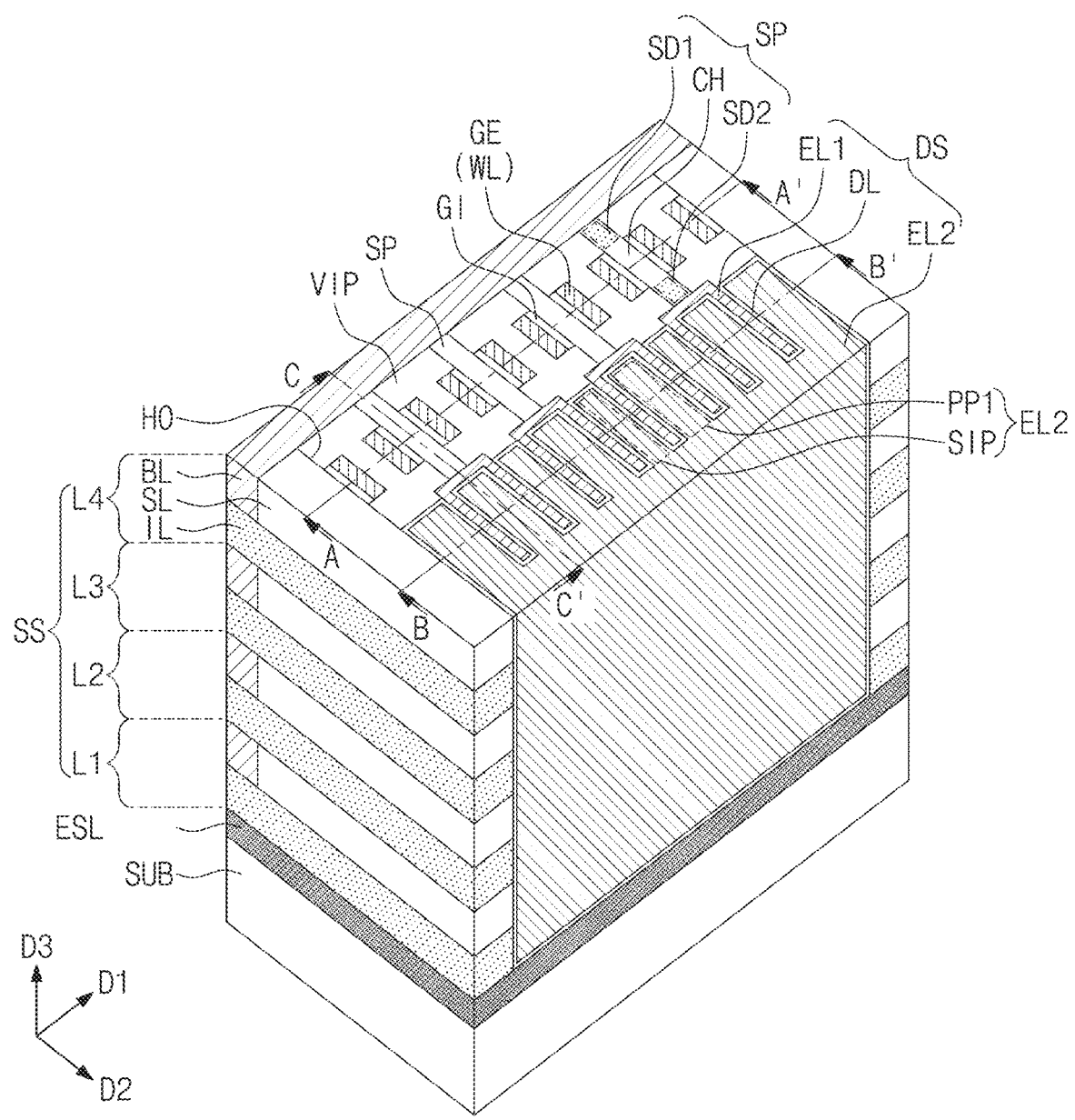
FIG. 20 illustrates a perspective view showing a three-dimensional semiconductor memory device according to some example embodiments of inventive concepts.
Figure 21A:
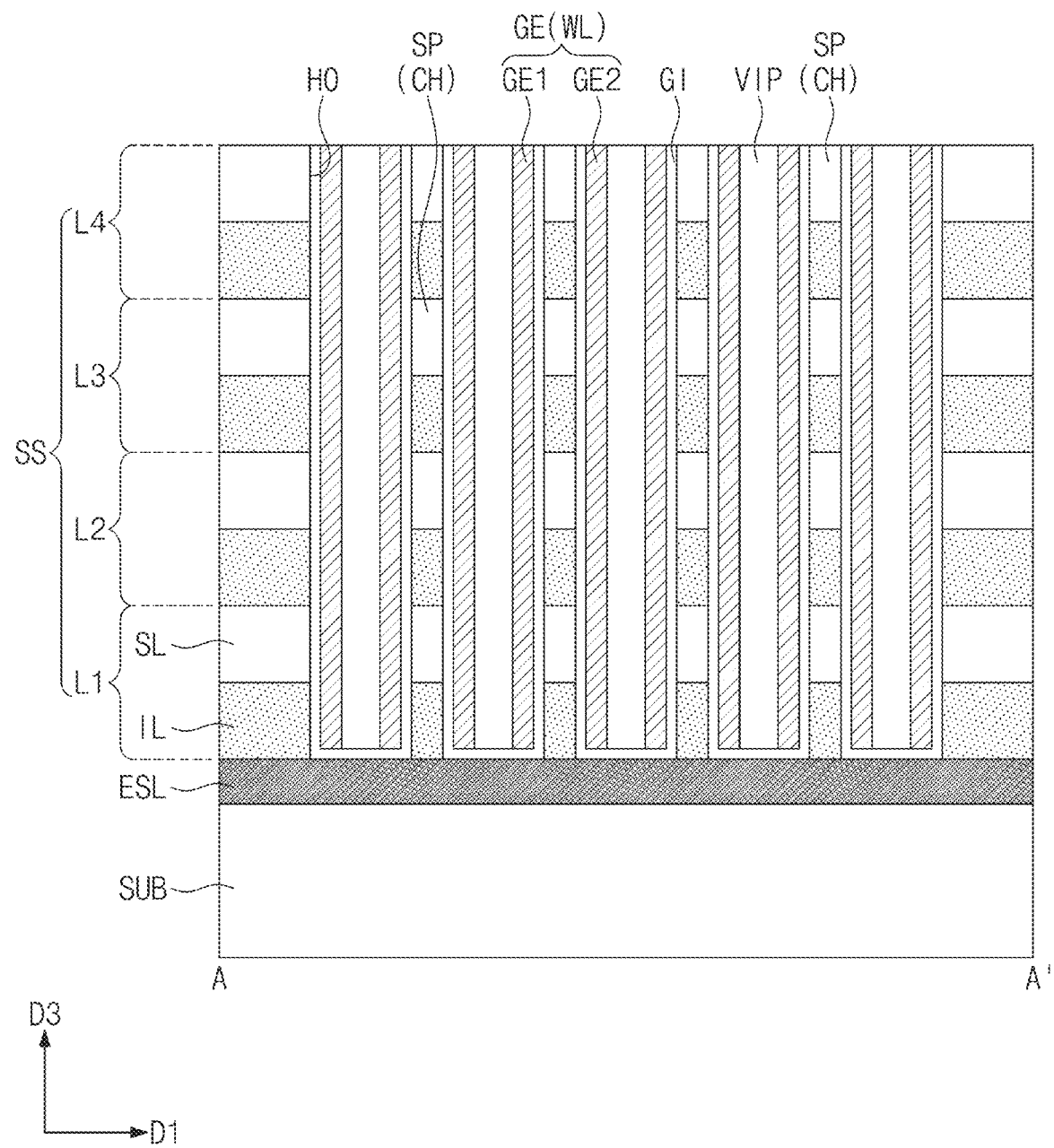
FIGS. 21A, 21B, and 21C illustrate cross-sectional views respectively taken along lines A-A', B-B', and C-C' of FIG. 20.
Figure 21B:
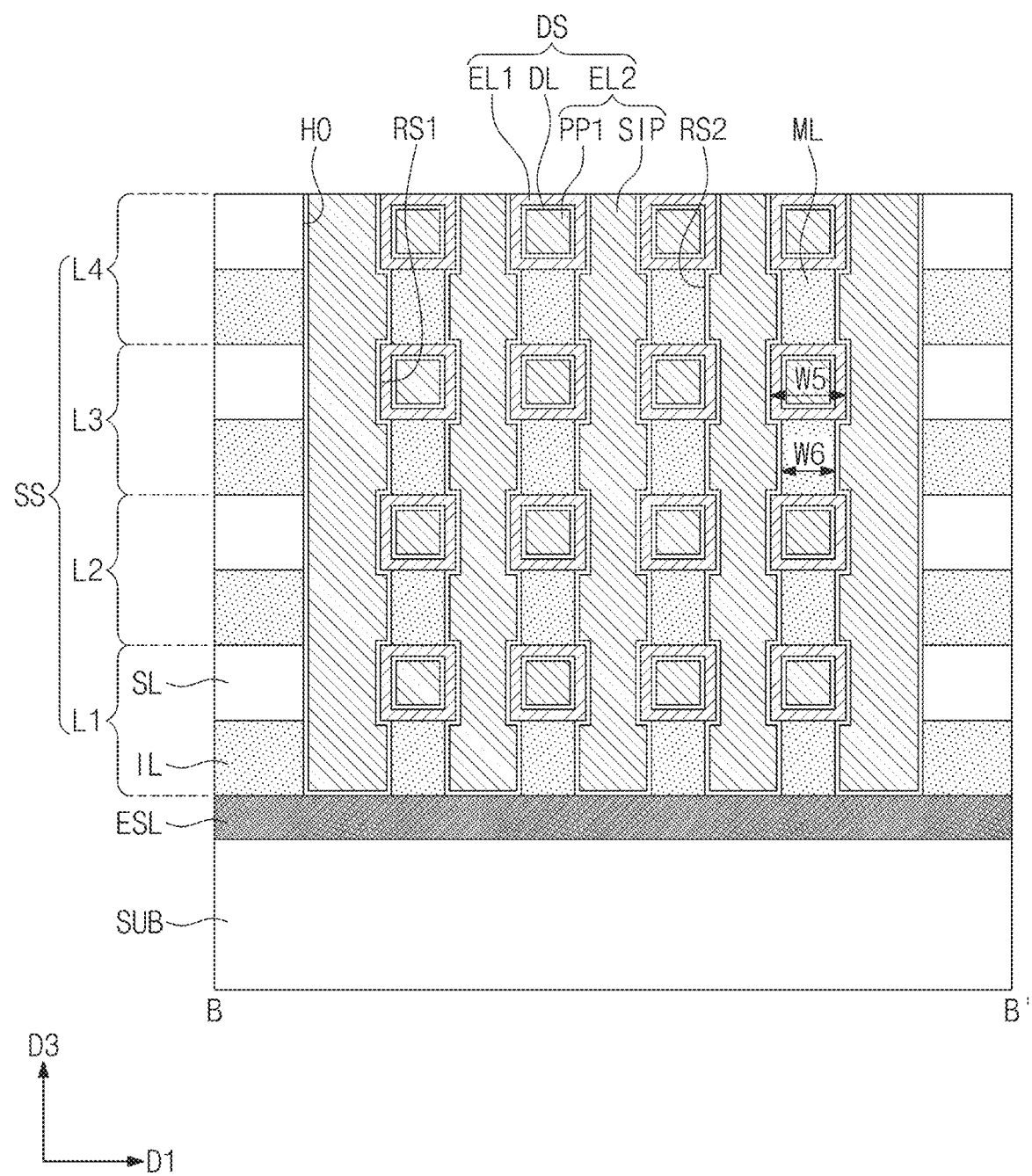
Figure 21C:
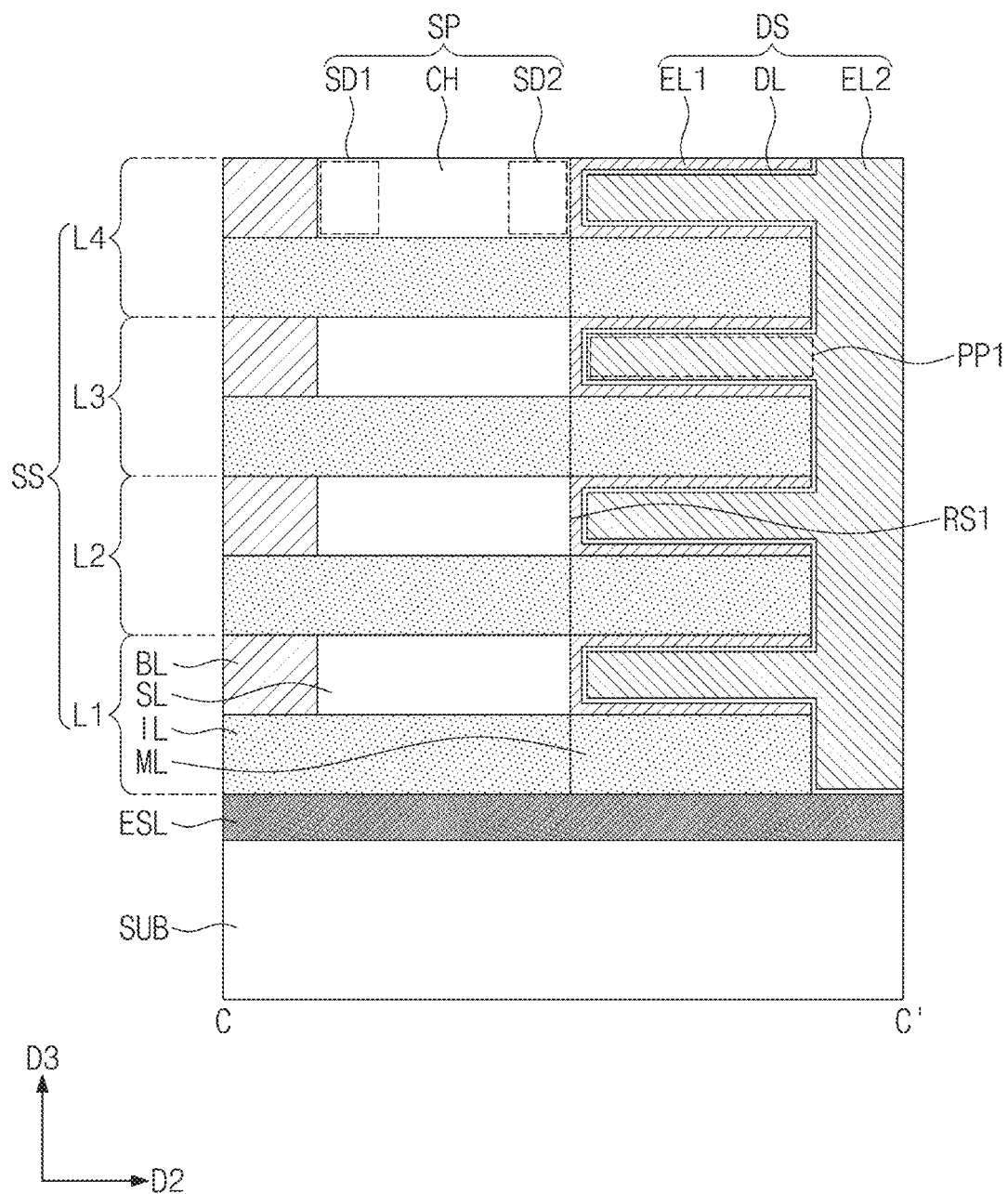

FIG. 20 illustrates a perspective view showing a three-dimensional semiconductor memory device according to some example embodiments of inventive concepts. FIGS. 21A, 21B, and 21C illustrate cross-sectional views respectively taken along lines A-A', B-B', and C-C' of FIG. 20. In the embodiment that follows, a detailed description of technical features repetitive to those discussed above with reference to FIGS. 3 and 4A to 4C will be omitted, and a difference thereof will be discussed in detail.

Referring to FIGS. 20 and 21A to 21C, the mold layer ML may be interposed between the first electrodes EL1 that are vertically adjacent to each other. The mold layer ML may connect the first electrodes EL1 that are vertically stacked. A fifth width W5 may be given as a maximum width in the first direction D1 of the first electrode EL1. A sixth width W6 may be given as a maximum width in the first direction D1 of the mold layer ML. The fifth width W5 may be greater than the sixth width W6.

The second electrode EL2 may include a first protrusion PP1 that is provided in the cylinder of the first electrode EL1 and a side part SIP that is adjacent to opposite sides of the first electrode EL1. The first protrusion PP1 may protrude from the second electrode EL2 toward the semiconductor pattern SP. The side part SIP may be interposed between the first electrodes EL1 that are adjacent to each other in the first direction D1. The side part SIP may extend in the third direction D3 from a bottom surface of the stack structure SS toward a top surface of the stack structure SS.

According to some example embodiments of inventive concepts, the first electrode EL1 may have a width greater than that of the mold layer ML. For example, the cylinder of the first electrode EL1 may have an inner sidewall whose area is relatively large. The first protrusion PP1 of the second electrode EL2 may fill the cylinder of the first electrode EL1, and the side part SIP of the second electrode EL2 may be adjacent to opposite sidewalls of the first electrode EL1. Accordingly, a semiconductor device according to some example embodiments of inventive concepts may have an increased capacitance of a capacitor that includes the first electrode EL1, the second electrode EL2, and the dielectric layer DL between the first and second electrodes EL1 and EL2.

FIGS. 22A, 23A, 24A, 25A, and 26A illustrate cross-sectional views taken along line A-A' of FIG. 9, showing a method of fabricating a three-dimensional semiconductor memory device according to some example embodiments of inventive concepts. FIGS. 22B, 23B, 24B, 25B, and 26B illustrate cross-sectional views taken along line B-B' of FIG. 9, showing a method of fabricating a three-dimensional semiconductor memory device according to some example embodiments of inventive concepts. In the embodiment that follows, a detailed description of technical features repetitive to those discussed with reference to FIGS. 5 to 18B will be omitted, and a difference thereof will be discussed in detail.

Figure 22A:
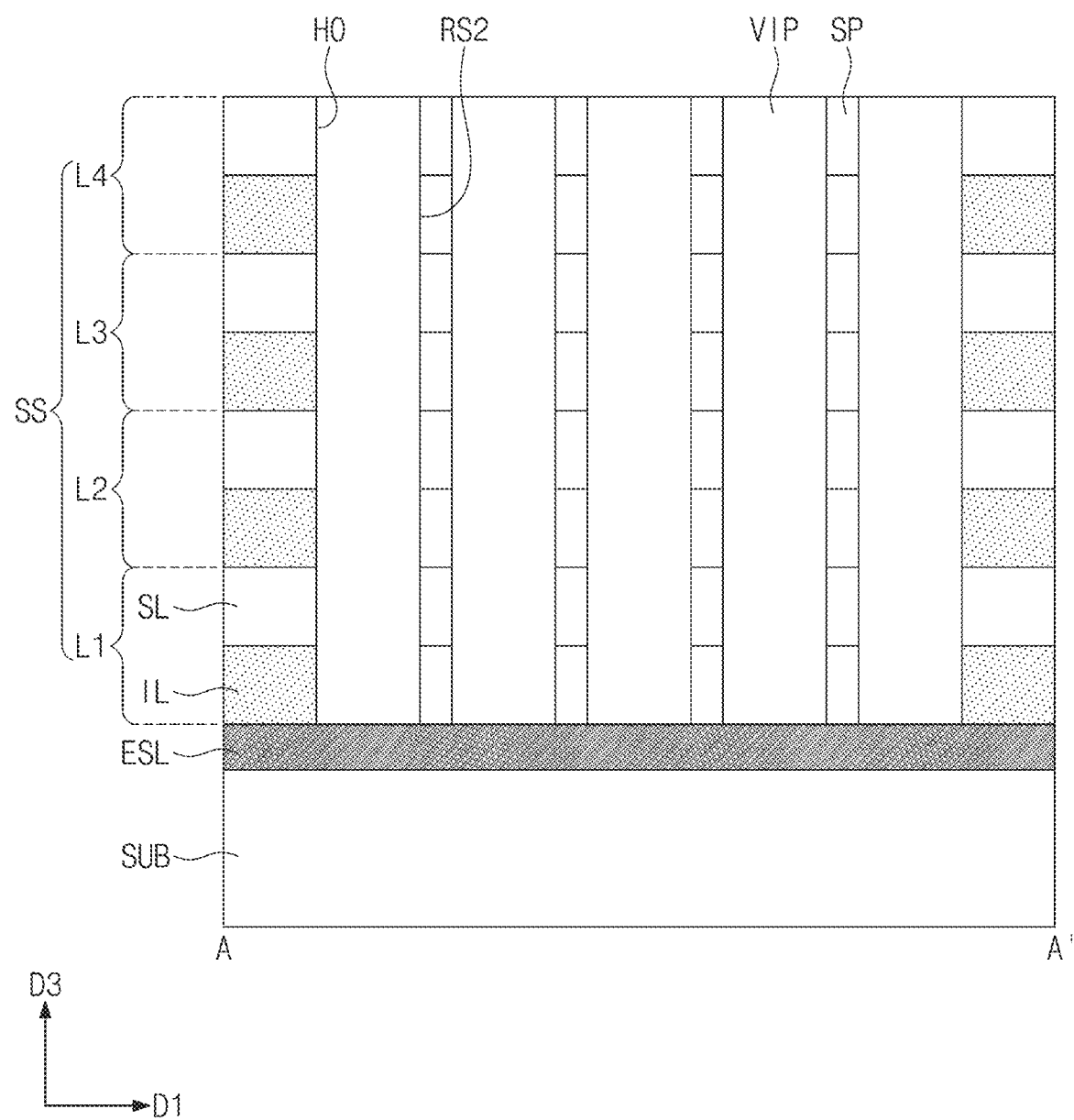
FIGS. 22A, 23A, 24A, 25A, and 26A illustrate cross-sectional views taken along line A-A' of FIG. 9, showing a method of fabricating a three-dimensional semiconductor memory device according to some example embodiments of inventive concepts.
Figure 22B:
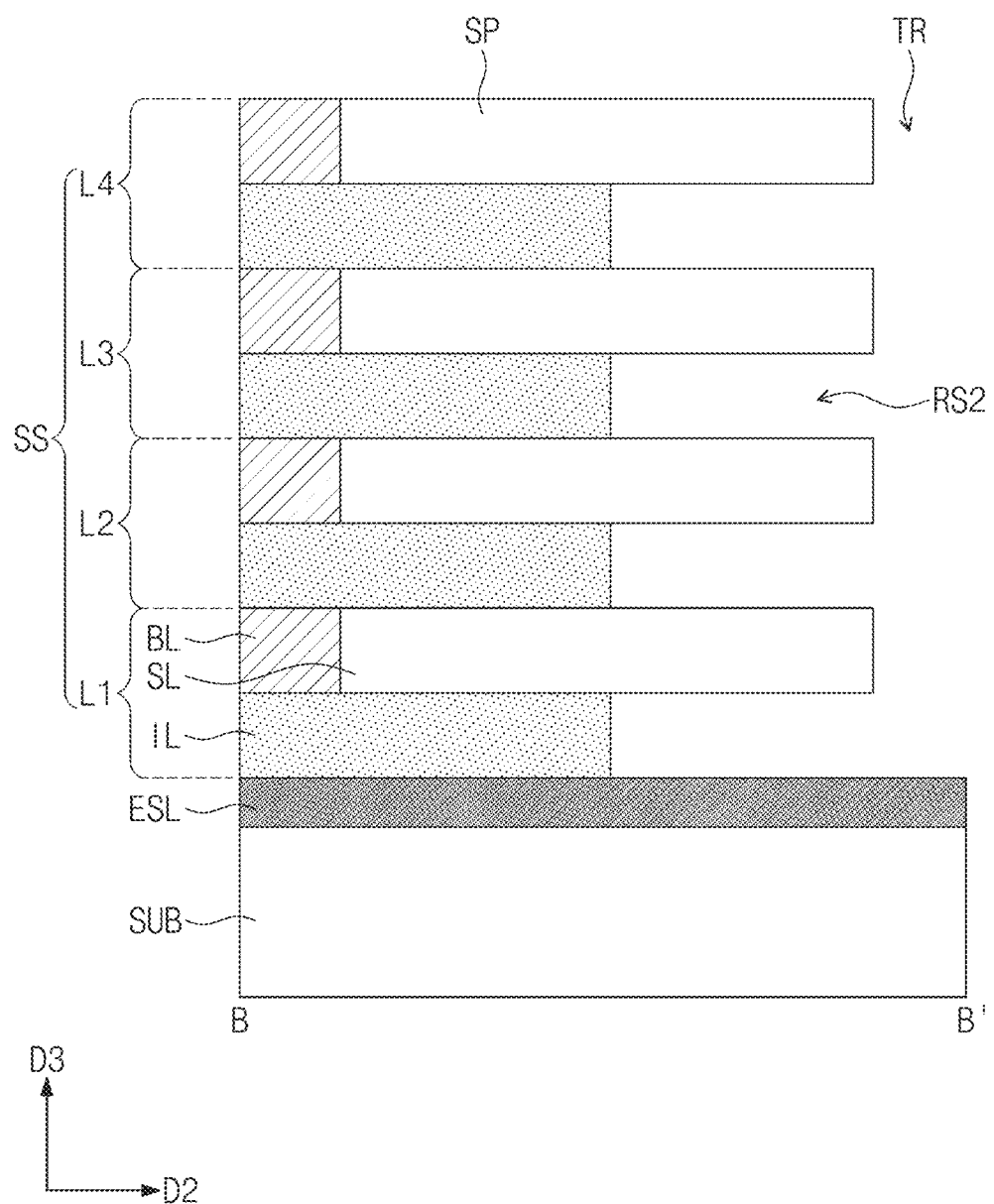
FIGS. 22B, 23B, 24B, 25B, and 26B illustrate cross-sectional views taken along line B-B' of FIG. 9, showing a method of fabricating a three-dimensional semiconductor memory device according to some example embodiments of inventive concepts.

Referring to FIGS. 9, 22A, and 22B, a wet etching process may be performed on a resultant structure shown in FIGS. 9, 10A, and 10B, such that the insulating layers IL may be selectively etched. The insulating layers IL exposed to the trench TR may be partially removed to form the second recesses RS2. The second recesses RS2 may horizontally extend from the trench TR toward remaining insulating layers IL.

Figure 23A:
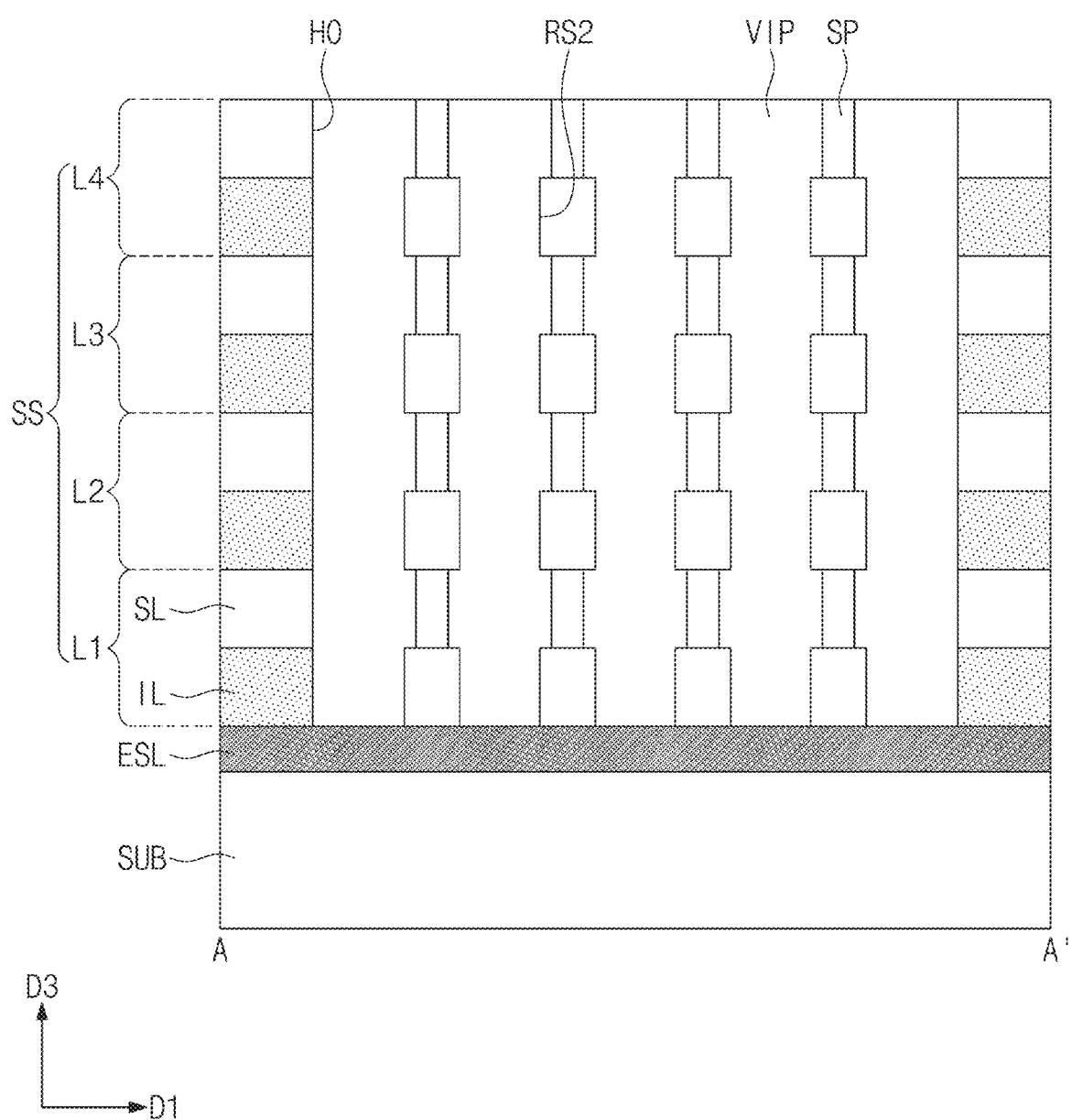
Figure 23B:
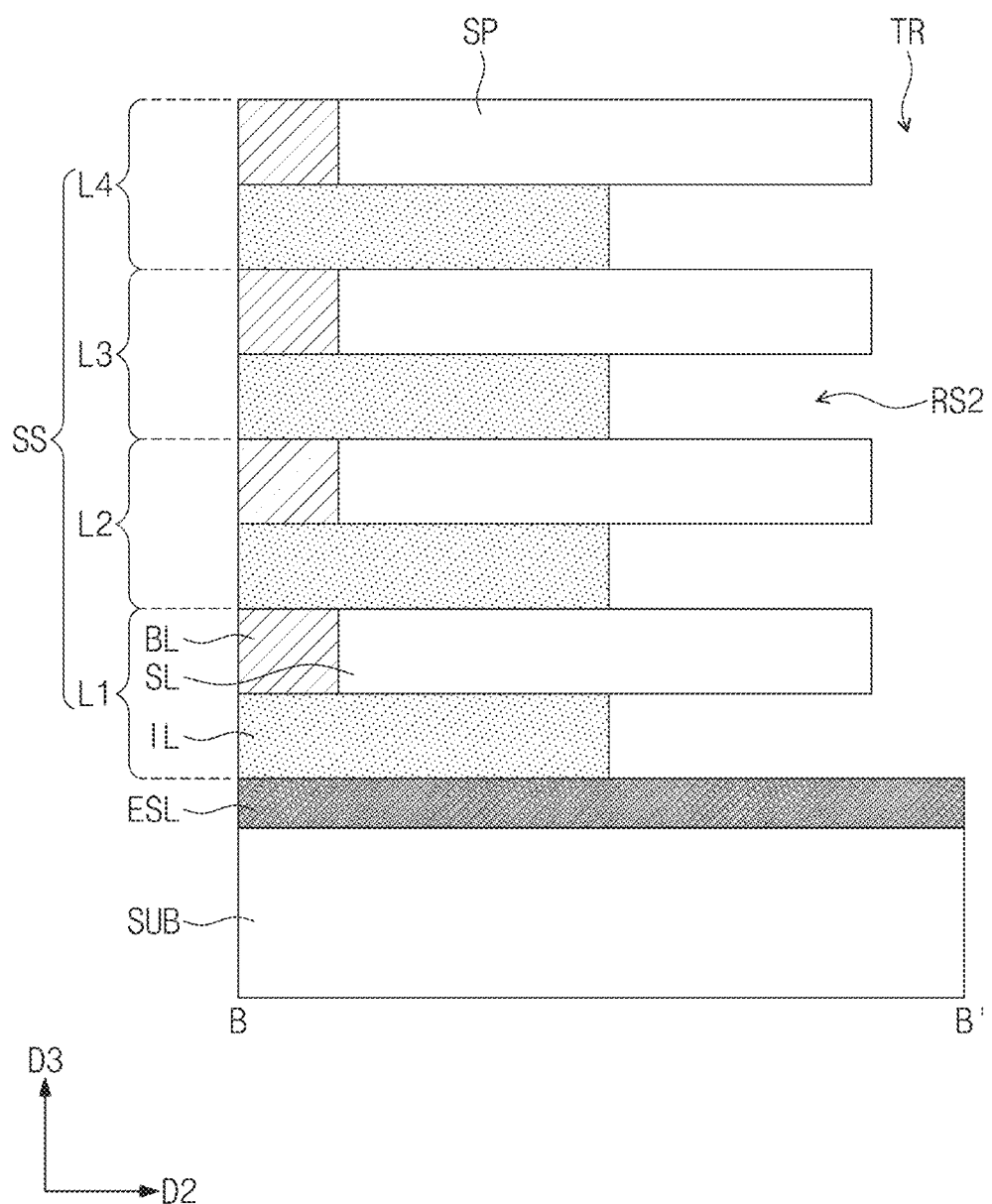

Referring to FIGS. 9, 23A, and 23B, the vertical insulating layer VIP may be selectively etched through the second recesses RS2, and thus the second recesses RS2 may expand in the first direction D1. Owing to the selective etching, the vertical insulating layer VIP may be removed at its portion adjacent to the second recesses RS2. The expansion may allow the second recess RS2 to have a maximum width in the first direction D1 greater than a maximum width in the first direction D1 of the semiconductor pattern SP.

Figure 24A:
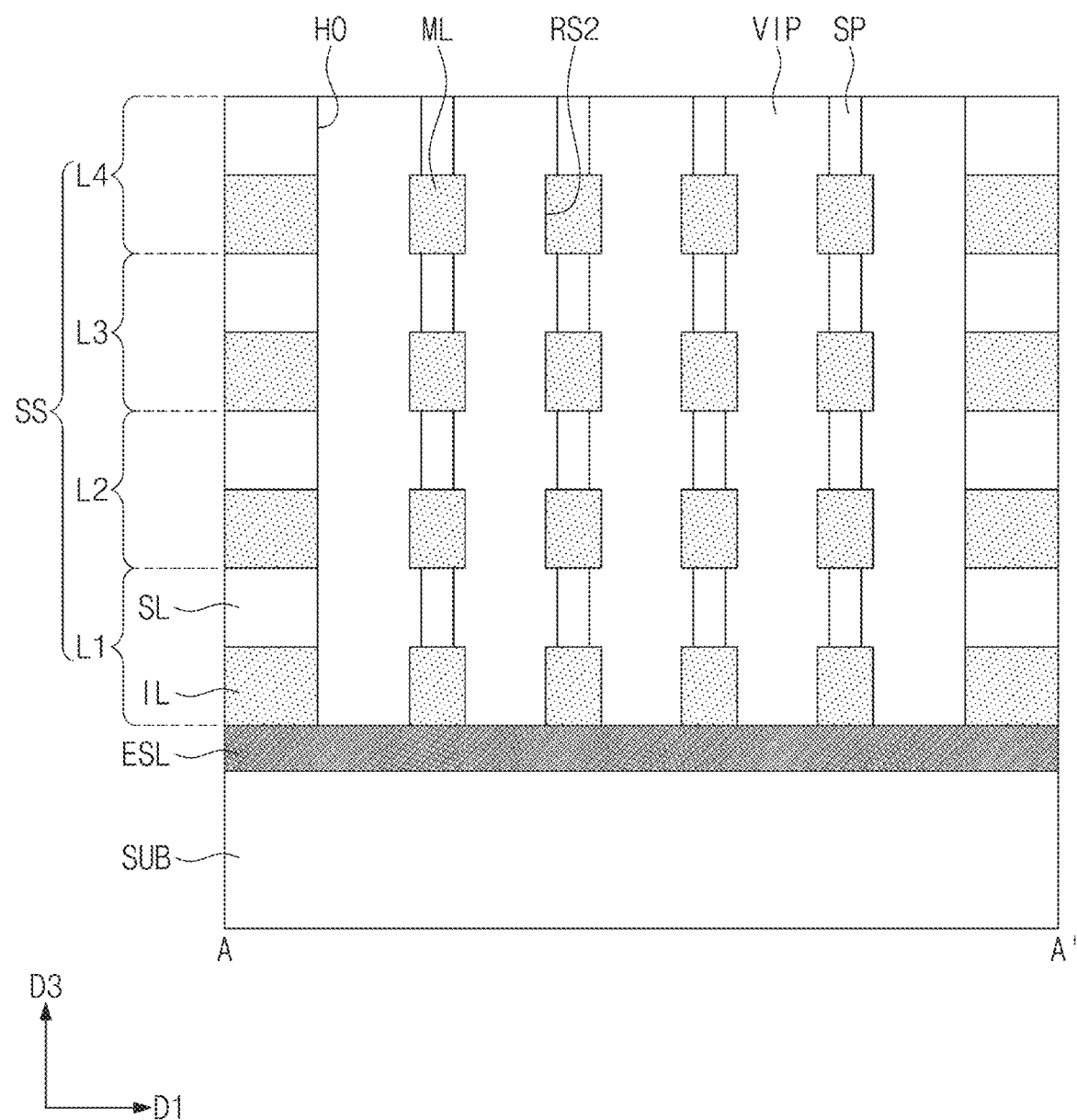
Figure 24B:
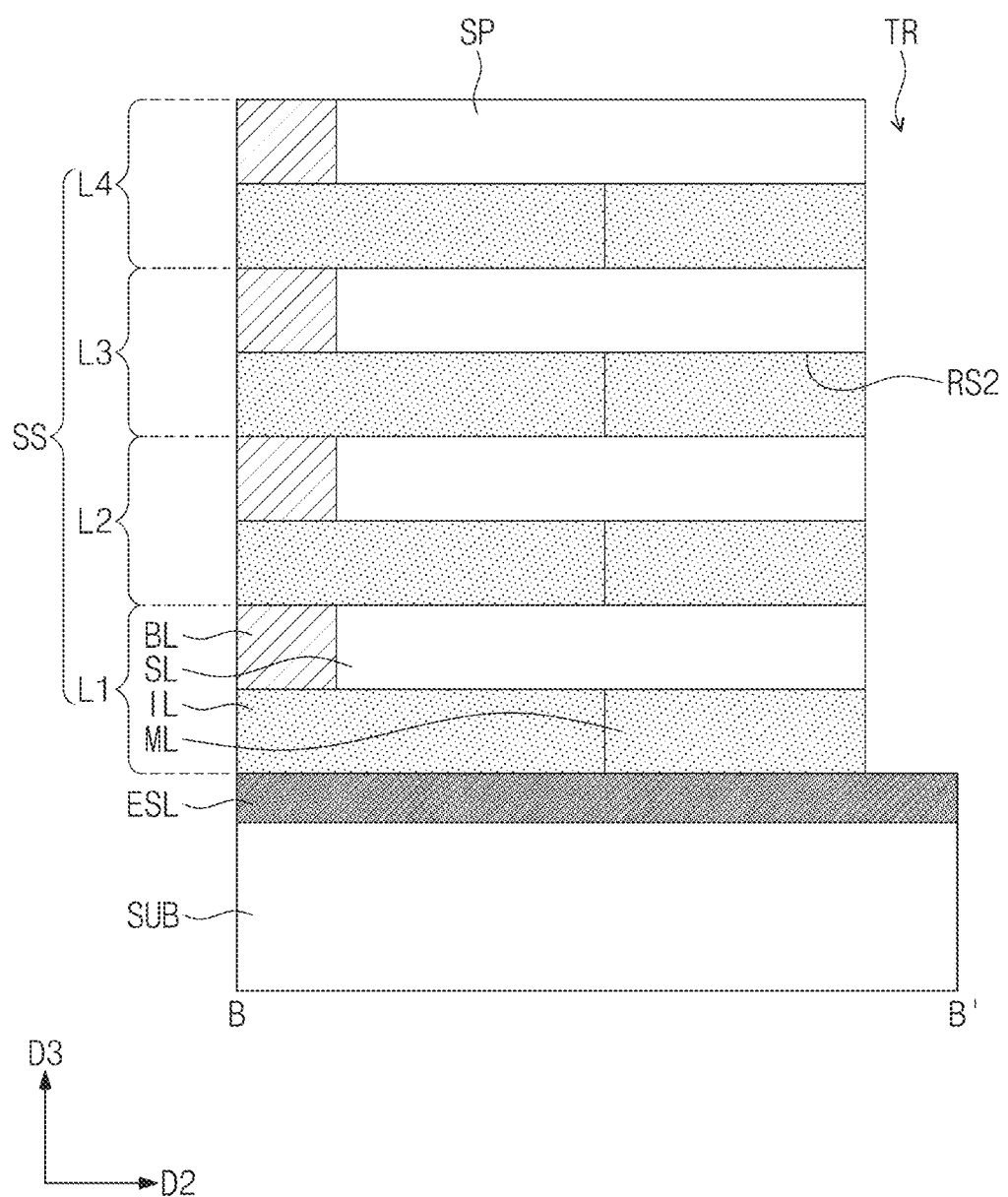

Referring to FIGS. 9, 24A, and 24B, the mold layer ML may be formed to fill the second recesses RS2. The mold layer ML may fill the trench TR. The mold layer ML may be formed of the same material as that of the insulating layers IL.

Figure 25A:
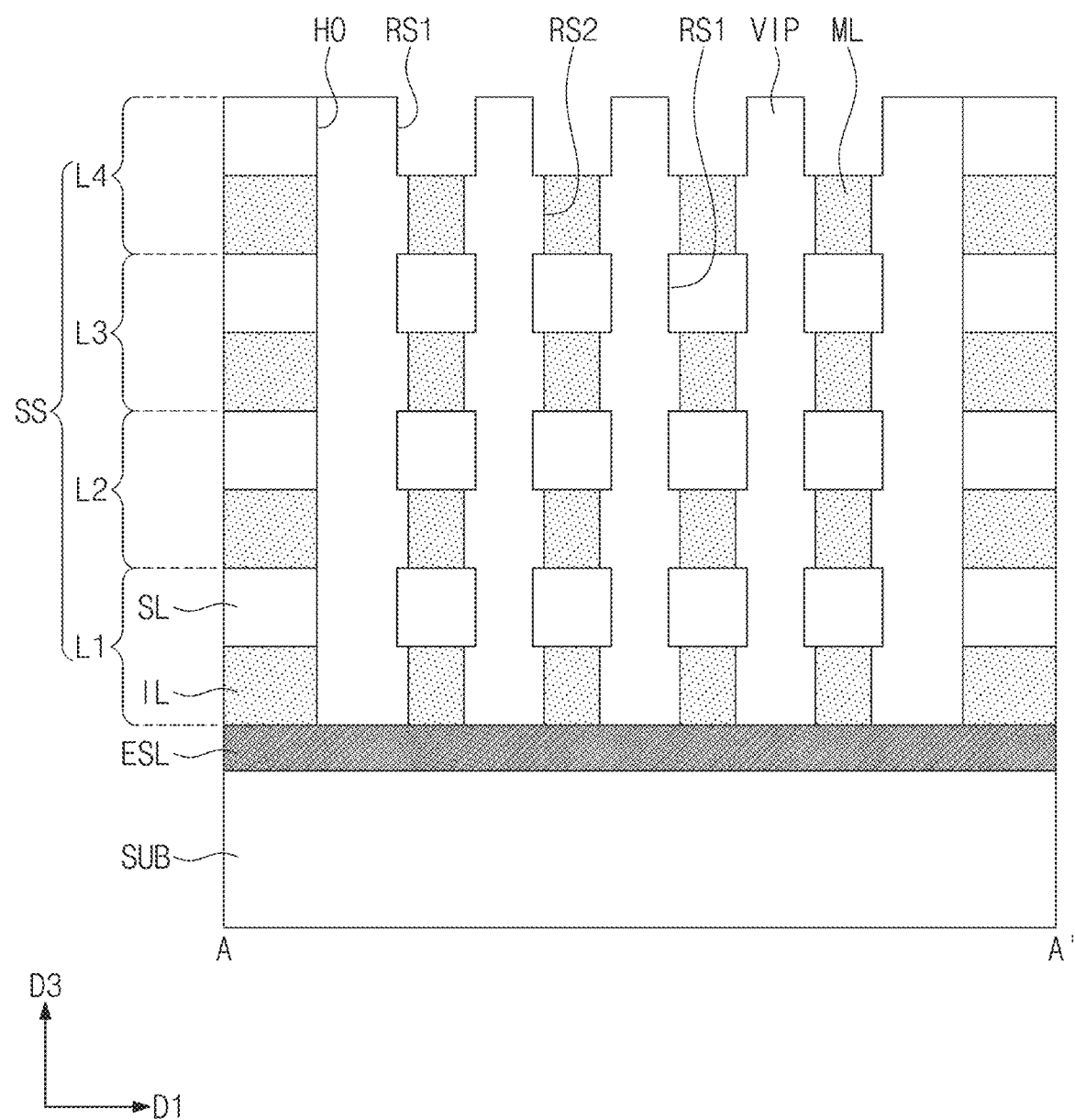
Figure 25B:
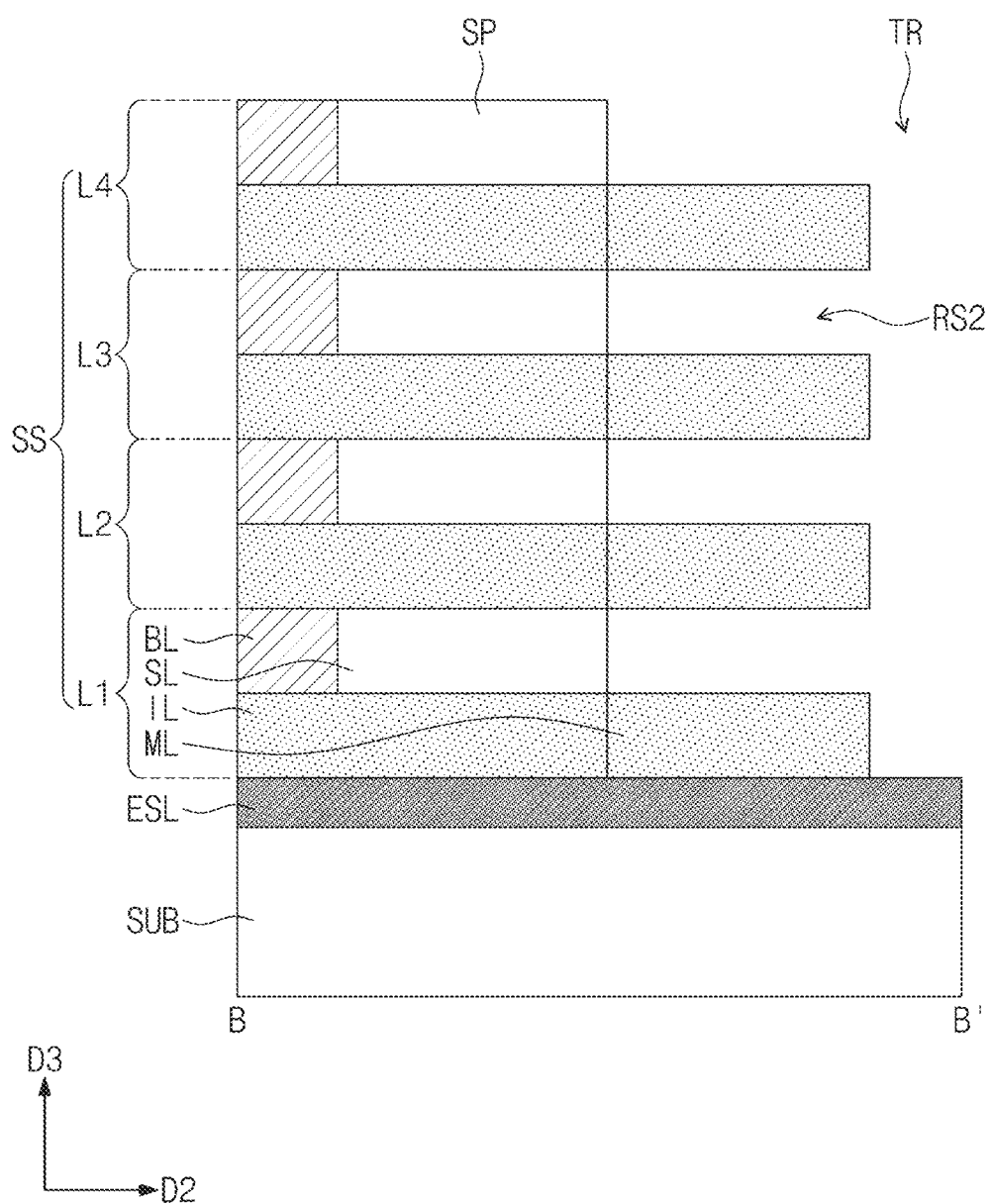

Referring to FIGS. 9, 25A, and 25B, the semiconductor patterns SP exposed to the trench TR may be selectively wet-etched to form the first recesses RS1. The first recesses RS1 may horizontally extend from the trench TR toward the bit lines BL.

The vertical insulating layer VIP may be selectively etched through the first recesses RS1, and thus the first recesses RS1 may expand in the first direction D1. Owing to the selective etching, the vertical insulating layer VIP may be removed at its portion adjacent to the first recesses RS1. The expansion may allow the first recess RS1 to have a maximum width in the first direction D1 greater than the maximum width in the first direction D1 of the second recess RS2.

Figure 26A:
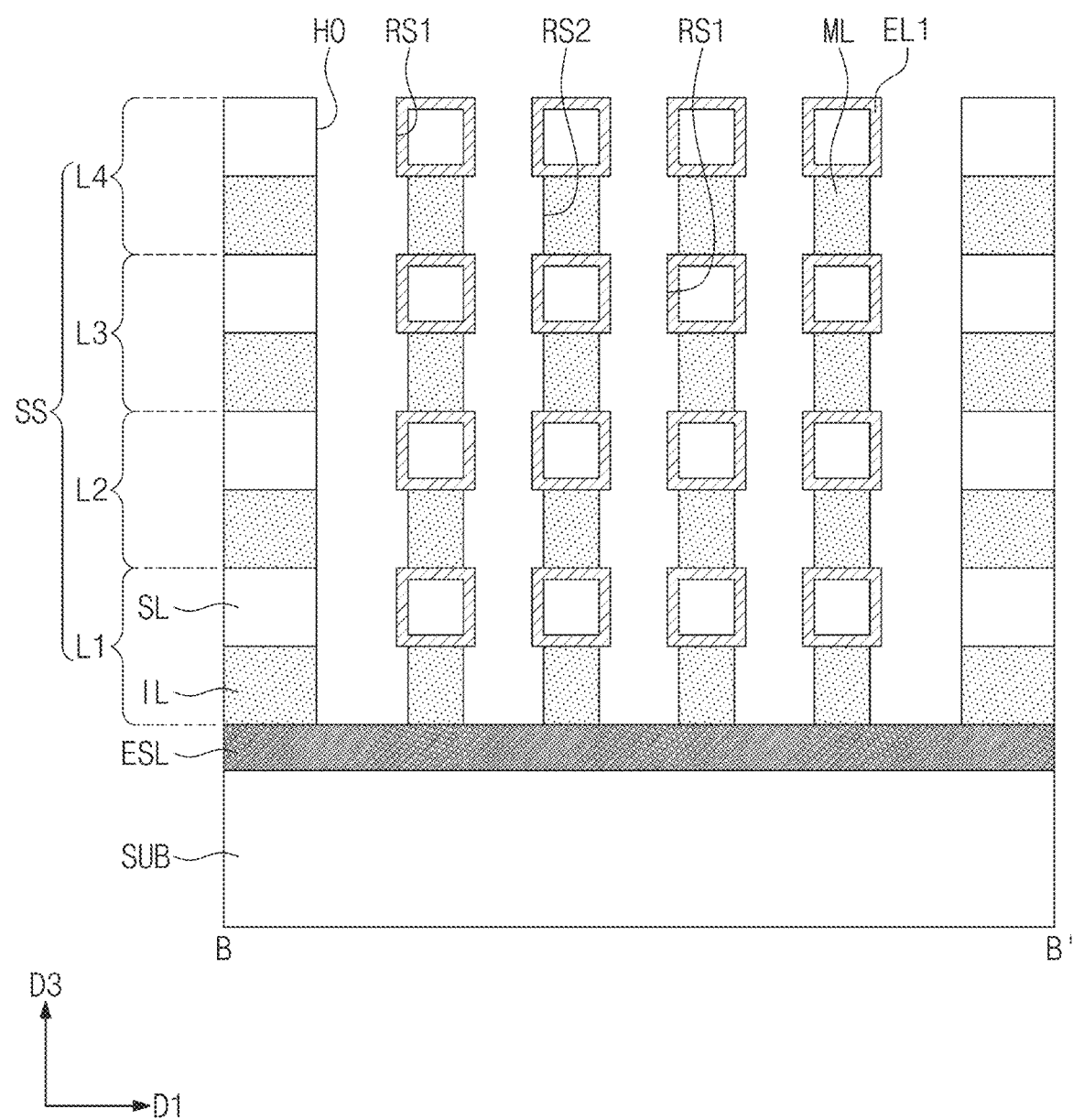
Figure 26B:
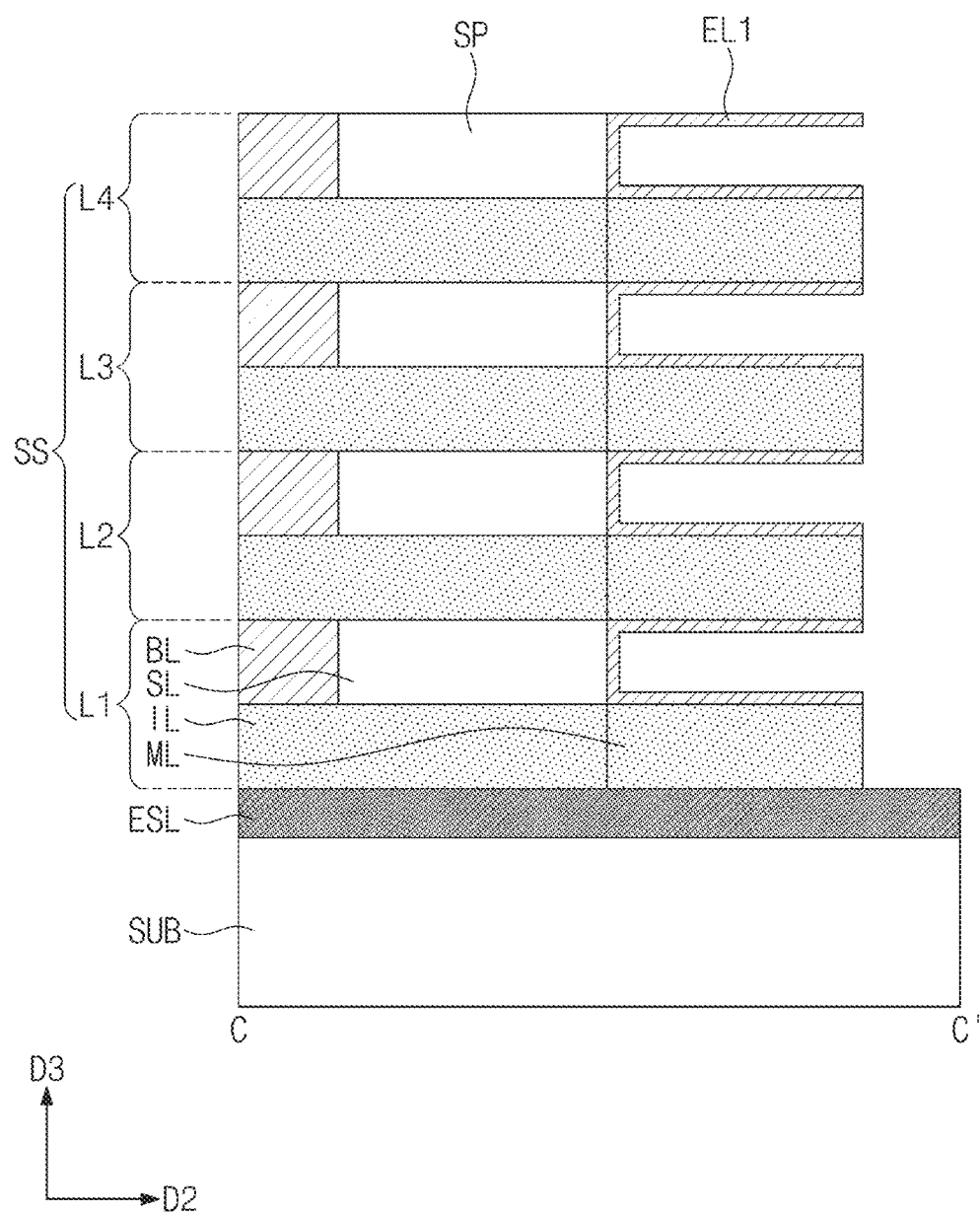

Referring to FIGS. 9, 26A, and 26B, the first electrodes EL1 may be formed in corresponding first recesses RS1. For example, the formation of the first electrodes EL1 may include conformally forming a first electrode layer in the first recesses RS1, and performing a wet etching process in which the first electrode layer is separated into a plurality of first electrodes EL1. The first electrode EL1 may then have a cylindrical shape whose one end is opened.

After the formation of the first electrodes EL1, a wet etching process may be performed to selectively etch the vertical insulating layer VIP. Thus, the vertical insulating layer VIP may be removed at its portion exposed to the trench TR. The removal of the vertical insulating layer VIP may expose opposite sidewalls of the first electrode EL1 and an inner sidewall of the first electrode EL1.

Referring back to FIGS. 20 and 21A to 21C, the dielectric layer DL may be conformally formed on the substrate SUB. The dielectric layer DL may cover an exposed surface of the first electrode EL1. The second electrode EL2 may be formed to fill the trench TR. The second electrode EL2 may include a first protrusion PP1 that fills the cylinder of the first electrode EL1 and a side part SIP that is adjacent to opposite sides of the first electrode EL1.

Figure 27:
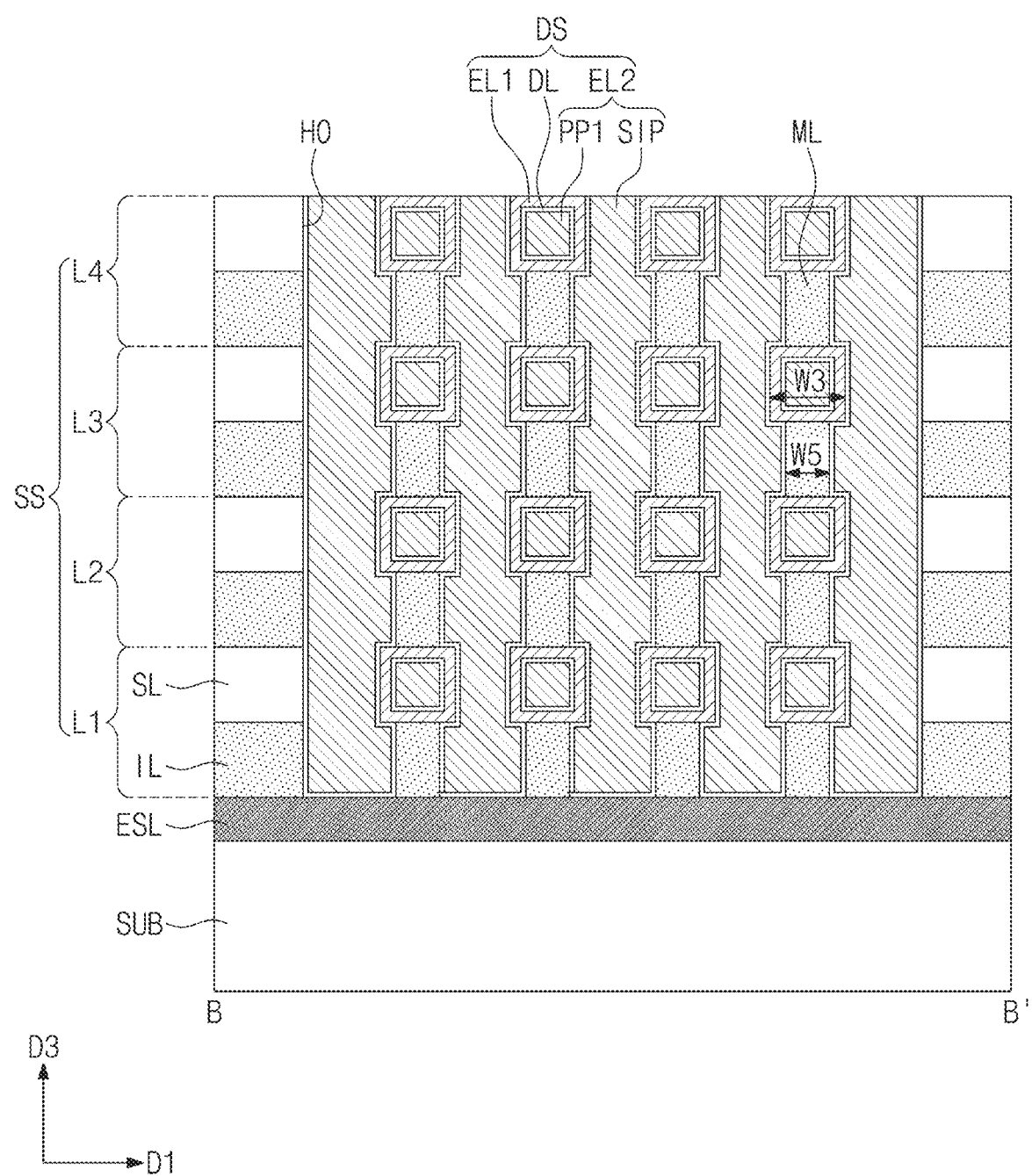
FIG. 27 illustrates a cross-sectional view taken along line B-B' of FIG. 20, showing a three-dimensional semiconductor memory device according to some example embodiments of inventive concepts.

FIG. 27 illustrates a cross-sectional view taken along line B-B' of FIG. 20, showing a three-dimensional semiconductor memory device according to some example embodiments of inventive concepts. In the embodiment that follows, a detailed description of technical features repetitive to those discussed above with reference to FIGS. 20 and 21A to 21C will be omitted, and a difference thereof will be discussed in detail.

Referring to FIGS. 20, 21A, 21C, and 27, a fifth width W5 may be given as a maximum width in the first direction D1 of the mold layer ML. The fifth width W5 may be greater than the sixth width W6. The fifth width W5 may be less than the sixth width W6 illustrated above in FIG. 21B. A width of the mold layer ML may decrease to increase an area between an outer sidewall of the first electrode EL1 and the side part SIP of the second electrode EL2. As a result, a capacitor may increase in capacitance.

A three-dimensional semiconductor memory device according to some example embodiments of inventive concepts may include a vertical insulating layer that physically supports first and second electrodes of a data storage element. Because the vertical insulating layer physically connects and supports the first electrodes that are vertically stacked, the first electrodes may be limited and/or prevented from collapsing. Consequently, the semiconductor device according to some example embodiments of inventive concepts may limit and/or prevent process defects and improve its reliability.

Although some example embodiments of inventive concepts have been discussed with reference to accompanying figures, it will be understood that various changes in form and details may be made therein without departing from the spirit and scope of inventive concepts. It therefore will be understood that the some example embodiments described above are just illustrative but not limitative in all aspects.

What is claimed is:

1. A semiconductor memory device, comprising:
   a substrate;
   a stack structure on the substrate,
      the stack structure defining a hole that penetrates the stack structure in a vertical direction,
      the stack structure including a plurality of layers vertically stacked on the substrate,
         the stack structure including a plurality of bit lines extending in a first direction and a plurality of semiconductor patterns extending in a second direction that intersects the first direction,
            each of the plurality of layers including a corresponding one of the plurality of semiconductor patterns extending in the second direction from a corresponding one of the plurality of bit lines;
   a gate electrode in the hole that penetrates the stack structure, the gate electrode vertically extending along a stack of the plurality of the semiconductor patterns;
   a vertical insulating layer that covers the gate electrode and fills the hole, the vertical insulating layer defining a first recess and a second recess; and
   a data storage element electrically connected to the corresponding one of the plurality of semiconductor patterns in a corresponding one of the plurality of layers,
   the data storage element including a first electrode and a second electrode,
      the first electrode being in the first recess of the vertical insulating layer, the first electrode having a cylindrical shape whose one end is opened, and
      the second electrode including a first protrusion in a cylinder of the first electrode and a second protrusion in the second recess of the vertical insulating layer.

2. The semiconductor memory device of claim 1, further comprising:
   a plurality of first electrodes stacked on the substrate, wherein
   the vertical insulating layer is physically connected to the plurality of the first electrodes that are stacked, and the plurality of first electrodes include the first electrode.

3. The semiconductor memory device of claim 1, wherein a maximum width in the first direction of the second recess is greater than a maximum width in the first direction of the first recess.

4. The semiconductor memory device of claim 1, wherein a maximum width in the first direction of the second protrusion is greater than a maximum width in the first direction of the first protrusion.

5. The semiconductor memory device of claim 1, wherein the first electrode, the first protrusion, and the second protrusion extend in the second direction.

6. The semiconductor memory device of claim 1, wherein
   the first recess exposes one end of the corresponding one of the plurality of the semiconductor patterns in the corresponding one of the plurality of layers to provide an exposed one end of the corresponding one of the plurality of the semiconductor patterns in the corresponding one of the plurality of layers, and
   the first electrode is electrically connected to the exposed one end of the corresponding one of the plurality of semiconductor patterns in the corresponding one of the plurality of layers.

7. The semiconductor memory device of claim 1, wherein
   the vertical insulating layer defines a plurality of first recesses that are vertically arranged,
   the plurality of first recesses include the first recess, and
   the second recess is between a pair of the plurality of first recesses that are vertically adjacent to each other.

8. The semiconductor memory device of claim 1, wherein the corresponding one of the plurality of semiconductor patterns in the corresponding one of the plurality of layers includes:
   a first impurity region electrically connected to the corresponding one of the plurality of bit lines;
   a second impurity region electrically connected to the first electrode; and
   a channel region between the first impurity region and the second impurity region, the channel region being adjacent to the gate electrode.

9. The semiconductor memory device of claim 1, wherein the data storage element further includes a dielectric layer between the first electrode and the second electrode.

10. The semiconductor memory device of claim 1, wherein
   the gate electrode includes a first gate electrode and a second gate electrode,
      the first gate electrode is adjacent to a first side of the corresponding one of the plurality of semiconductor patterns in the corresponding one of the plurality of layers,
      the second gate electrode is adjacent to a second side of the corresponding one of the plurality of semiconductor patterns in the corresponding one of the plurality of layers, and
      the second side is opposite the first side in the first direction.

11. A semiconductor memory device, comprising:
   a substrate;
   a stack structure on the substrate,
      the stack structure defining a hole that penetrates the stack structure in a vertical direction,
      the stack structure including a plurality of layers vertically stacked on the substrate,
         the stack structure including a plurality of bit lines extending in a first direction and a plurality of semiconductor patterns extending in a second direction that intersects the first direction,
each of the plurality of layers including a corresponding one of the plurality of semiconductor patterns extending in the second direction from a corresponding one of the plurality of bit lines;
a gate electrode in the hole that penetrates the stack structure, the gate electrode vertically extending along a stack of the plurality of semiconductor patterns;
a plurality of first electrodes electrically connected to the plurality of semiconductor patterns, respectively,
each of the plurality of first electrodes having a cylindrical shape whose one end is opened;
a dielectric layer on the substrate; and
a second electrode on the substrate, the second electrode spaced apart from the plurality of first electrodes across the dielectric layer,
the second electrode including a first protrusion and a second protrusion, the first protrusion being in a cylinder of a corresponding one of the plurality of first electrodes, the first protrusion extending in the second direction,
the second protrusion being between two of the plurality of first electrodes that are vertically adjacent to each other, the second protrusion extending in the second direction,
a maximum width in the first direction of the second protrusion being greater than a maximum width in the first direction of the first protrusion.

12. The semiconductor memory device of claim 11, further comprising:
a vertical insulating layer that covers the gate electrode and fills the hole in the stack structure, wherein
the vertical insulating layer is physically connected to a stack of the plurality of first electrodes.

13. The semiconductor memory device of claim 11, wherein the plurality of first electrodes, the first protrusion, and the second protrusion extend in the second direction.

14. The semiconductor memory device of claim 11, wherein the corresponding one of the plurality of semiconductor patterns includes:
a first impurity region electrically connected to the corresponding one of the plurality of bit lines;
a second impurity region electrically connected to one of the plurality of first electrodes; and
a channel region between the first impurity region and the second impurity region, the channel region being adjacent to the gate electrode.

15. The semiconductor memory device of claim 11, wherein
the gate electrode includes a first gate electrode and a second gate electrode,
the first gate electrode is adjacent to a first side of the corresponding one of the plurality of semiconductor patterns in a corresponding one of the plurality of layers,
the second gate electrode is adjacent to a second side of the corresponding one of the plurality of semiconductor patterns in the corresponding one of the plurality of layers, and
the second side being opposite in the first direction to the first side.

16. A semiconductor memory device, comprising:
a substrate;
a stack structure on the substrate,
the stack structure defining a hole that penetrates the stack structure in a vertical direction,
the stack structure including a plurality of layers vertically stacked on the substrate,
the stack structure including a plurality of bit lines extending in a first direction and a plurality of semiconductor patterns extending in a second direction that intersects the first direction,
each of the plurality of layers including a corresponding one of the plurality of semiconductor patterns extending in the second direction from a corresponding one of the plurality of bit lines;
a gate electrode in the hole that penetrates the stack structure, the gate electrode vertically extending along a stack of the plurality of semiconductor patterns;
a vertical insulating layer that covers the gate electrode and fills the hole, the vertical insulating layer defining a pair of first recesses and a second recess between the pair of first recesses, the pair of first recesses exposing one end of a pair of the plurality of semiconductor patterns and extending in the second direction,
the pair of the first recesses being vertically adjacent to each other, and
the second recess extending in the second direction; and
a data storage element electrically connected to the corresponding one of the plurality of semiconductor patterns in a corresponding one of the plurality of layers,
the data storage element including a first electrode in one of the pair of first recesses and a second electrode in the second recess, a maximum width in the first direction of the second recess being greater than a maximum width in the first direction of each of the pair of first recesses.

17. The semiconductor memory device of claim 16, further comprising:
a plurality of first electrodes on the substrate, wherein
the vertical insulating layer is physically connected to a stack of the plurality of first electrodes, and
the plurality of first electrodes include the first electrode.

18. The semiconductor memory device of claim 16, wherein
the first electrode has a cylindrical shape whose one end is opened,
the second electrode includes a first protrusion and a second protrusion,
the first protrusion in a cylinder of the first electrode,
the second protrusion is in the second recess, and
a maximum width in the first direction of the second protrusion is greater than a maximum width in the first direction of the first protrusion.

19. The semiconductor memory device of claim 16, wherein the data storage element further includes a dielectric layer between the first electrode and the second electrode.

20. The semiconductor memory device of claim 16, wherein the corresponding one of the plurality of semiconductor patterns in the corresponding one of the plurality of layers includes:
a first impurity region electrically connected to the corresponding one of the plurality of bit lines;
a second impurity region electrically connected to the first electrode; and
a channel region between the first impurity region and the second impurity region, the channel region being adjacent to the gate electrode.

* * * * *